US012701764B2

(12) United States Patent
Rascuna' et al.

(10) Patent No.: US 12,701,764 B2
(45) Date of Patent: Aug. 4, 2026

(54) METHOD FOR CREATING AN OHMIC CONTACT ON A HIGH-POWER ELECTRICAL DIODE

(71) Applicant: STMicroelectronics International N.V., Geneva (CH)

(72) Inventors: Simone Rascuna', Catania (IT); Paolo Badala', Acireale (IT); Gabriele Bellocchi, Catania (IT); Valeria Puglisi, Catania (IT)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 328 days.

(21) Appl. No.: 18/348,012

(22) Filed: Jul. 6, 2023

(65) Prior Publication Data

US 2025/0015145 A1     Jan. 9, 2025

(51) Int. Cl.
*H10D 64/01*          (2025.01)
*H10D 8/01*           (2025.01)
(Continued)

(52) U.S. Cl.
CPC ............. *H10D 64/01* (2025.01); *H10D 8/051* (2025.01); *H10D 8/60* (2025.01); *H10D 62/8325* (2025.01); *H10D 64/62* (2025.01)

(58) Field of Classification Search
CPC .......... H10D 64/01; H10D 8/051; H10D 8/60; H10D 62/8325; H10D 64/62; H10D 62/85;
(Continued)

(56) References Cited

U.S. PATENT DOCUMENTS 6,110,813 A * 8/2000 Ota .................... H10D 62/8325
                                                  438/662
8,106,417 B2 * 1/2012 Yoo ...................... H10H 20/811
                                                  257/104
(Continued)

FOREIGN PATENT DOCUMENTS

JP        2014063948 A    4/2014
WO    WO 2022/047349 A2    3/2022

OTHER PUBLICATIONS

Extended European Search Report for Application No. 24182516.5, dated Dec. 2, 2024, 6 pages.
(Continued)

*Primary Examiner* — Steven B Gauthier
*Assistant Examiner* — Khatib A Rahman
(74) *Attorney, Agent, or Firm* — Alston & Bird LLP

(57) ABSTRACT

A method for forming an ohmic contact on a semiconductor component, for example a high-power electrical diode, is provided. An example method includes depositing a first metal layer on a top surface of a semiconductor drift layer having an electrical contact point, the first metal layer highly reflective of a laser light. The method further includes depositing a second metal layer on portions of the first metal layer aligned with the electrical contact point, the second metal layer selected to absorb the laser light. The method further includes exposing the first and the second metal layers to the laser light in a laser annealing process, causing the second metal layer to substantially increase in temperature due to the laser light. The increase in temperature of the second metal layer causing the ohmic contact to form between the electrical contact point and the first metal layer.

19 Claims, 20 Drawing Sheets

400

REMOVE THE FIRST METAL LAYER — 402

DEPOSIT A DIELECTRIC LAYER ON THE TOP SURFACE OF THE SEMICONDUCTOR DRIFT LAYER AND THE OHMIC CONTACTS — 404

REMOVE THE DIELECTRIC LAYER DIRECTLY ABOVE THE TOP SURFACE OF THE SEMICONDUCTOR DRIFT LAYER OF THE SEMICONDUCTOR COMPONENT, SUCH THAT THE OHMIC CONTACTS ARE EXPOSED — 406

DEPOSIT A FRONT-SIDE METAL, ON THE OHMIC CONTACTS AND THE DIELECTRIC LAYER — 408

REMOVE THE FRONT-SIDE METAL FROM ALL AREAS, EXCEPT AN ELECTRICAL DIODE AREA ON AND IMMEDIATELY AROUND THE OHMIC CONTACTS — 410

DEPOSIT A PASSIVATION LAYER ON THE SURFACE AND IMMEDIATELY AROUND THE FRONT-SIDE METAL — 412

ETCH AN ACCESS CHANNEL TO THE FRONT-SIDE METAL, THROUGH THE PASSIVATION LAYER — 414

(51) Int. Cl.
    *H10D 8/60*         (2025.01)
    *H10D 62/832*     (2025.01)
    *H10D 64/62*      (2025.01)

(58) Field of Classification Search
    CPC .. H10D 62/106; H10D 64/111; H01L 21/268;
                   H01L 21/0485; H01L 21/0495
    See application file for complete search history.

(56)               References Cited

U.S. PATENT DOCUMENTS

| | | | |
|---|---|---|---|
| 8,962,468 B1 | 2/2015 | Hostetler | |
| 2021/0280424 A1 * | 9/2021 | Rascuna' .................. | H10D 8/60 |
| 2021/0328023 A1 | 10/2021 | Rascuna' et al. | |

OTHER PUBLICATIONS

Zhang et al., "Device Design Assessment of GaN Merged P-i-N Schottky Diodes" Electronics 8, No. 12: 1550, (2019).

* cited by examiner

300

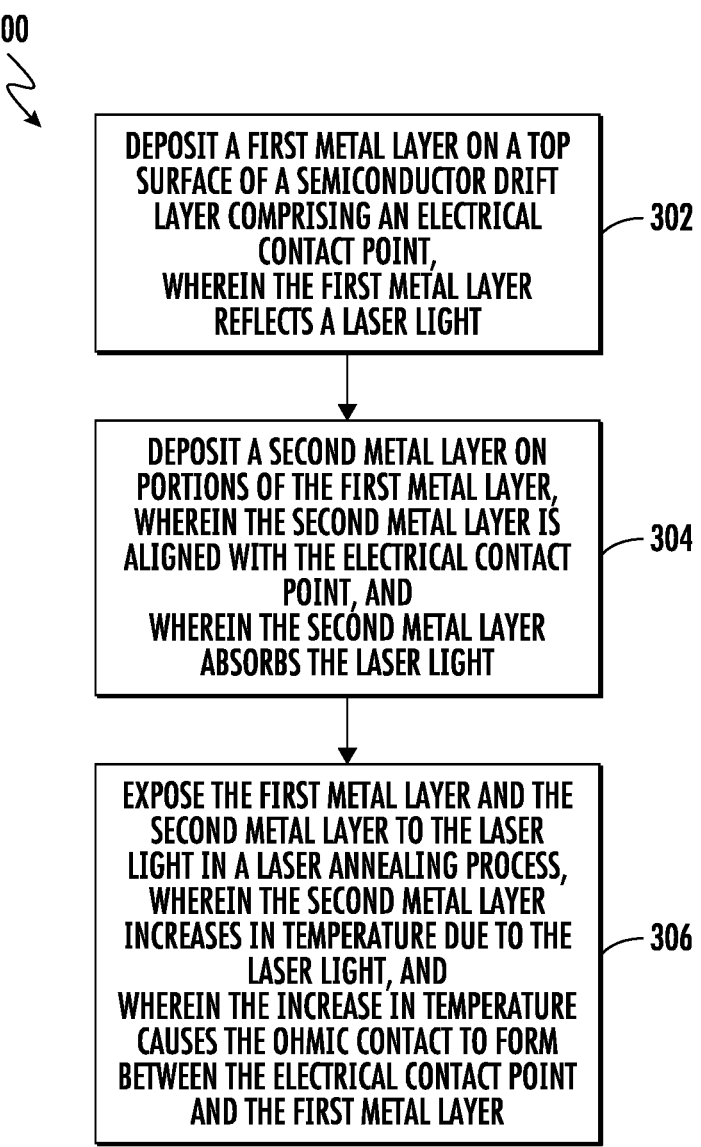

DEPOSIT A FIRST METAL LAYER ON A TOP SURFACE OF A SEMICONDUCTOR DRIFT LAYER COMPRISING AN ELECTRICAL CONTACT POINT,
WHEREIN THE FIRST METAL LAYER REFLECTS A LASER LIGHT — 302

DEPOSIT A SECOND METAL LAYER ON PORTIONS OF THE FIRST METAL LAYER, WHEREIN THE SECOND METAL LAYER IS ALIGNED WITH THE ELECTRICAL CONTACT POINT, AND
WHEREIN THE SECOND METAL LAYER ABSORBS THE LASER LIGHT — 304

EXPOSE THE FIRST METAL LAYER AND THE SECOND METAL LAYER TO THE LASER LIGHT IN A LASER ANNEALING PROCESS, WHEREIN THE SECOND METAL LAYER INCREASES IN TEMPERATURE DUE TO THE LASER LIGHT, AND
WHEREIN THE INCREASE IN TEMPERATURE CAUSES THE OHMIC CONTACT TO FORM BETWEEN THE ELECTRICAL CONTACT POINT AND THE FIRST METAL LAYER — 306

FIG. 3

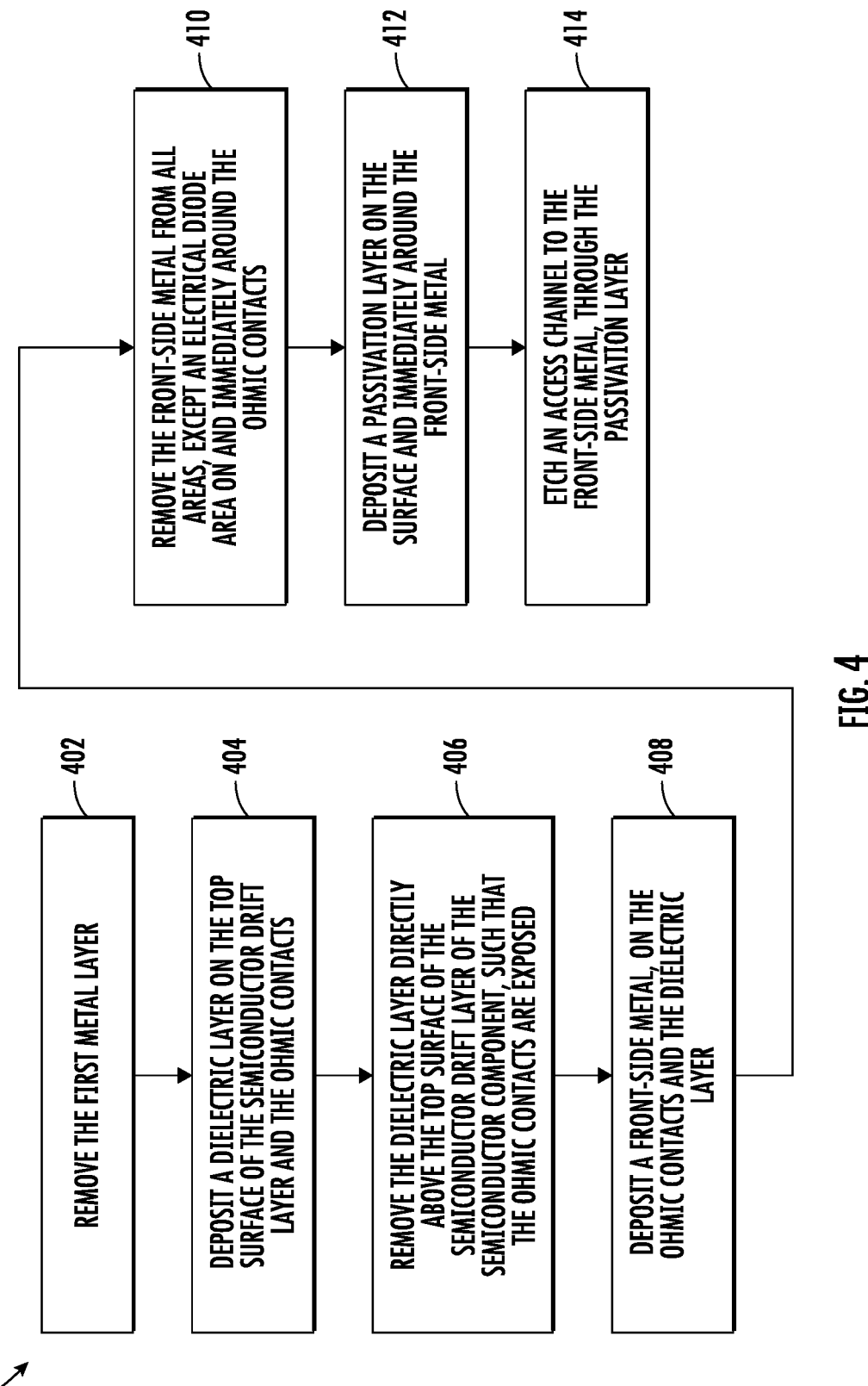

400

402 REMOVE THE FIRST METAL LAYER

404 DEPOSIT A DIELECTRIC LAYER ON THE TOP SURFACE OF THE SEMICONDUCTOR DRIFT LAYER AND THE OHMIC CONTACTS

406 REMOVE THE DIELECTRIC LAYER DIRECTLY ABOVE THE TOP SURFACE OF THE SEMICONDUCTOR DRIFT LAYER OF THE SEMICONDUCTOR COMPONENT, SUCH THAT THE OHMIC CONTACTS ARE EXPOSED

408 DEPOSIT A FRONT-SIDE METAL, ON THE OHMIC CONTACTS AND THE DIELECTRIC LAYER

410 REMOVE THE FRONT-SIDE METAL FROM ALL AREAS, EXCEPT AN ELECTRICAL DIODE AREA ON AND IMMEDIATELY AROUND THE OHMIC CONTACTS

412 DEPOSIT A PASSIVATION LAYER ON THE SURFACE AND IMMEDIATELY AROUND THE FRONT-SIDE METAL

414 ETCH AN ACCESS CHANNEL TO THE FRONT-SIDE METAL, THROUGH THE PASSIVATION LAYER

FIG. 4

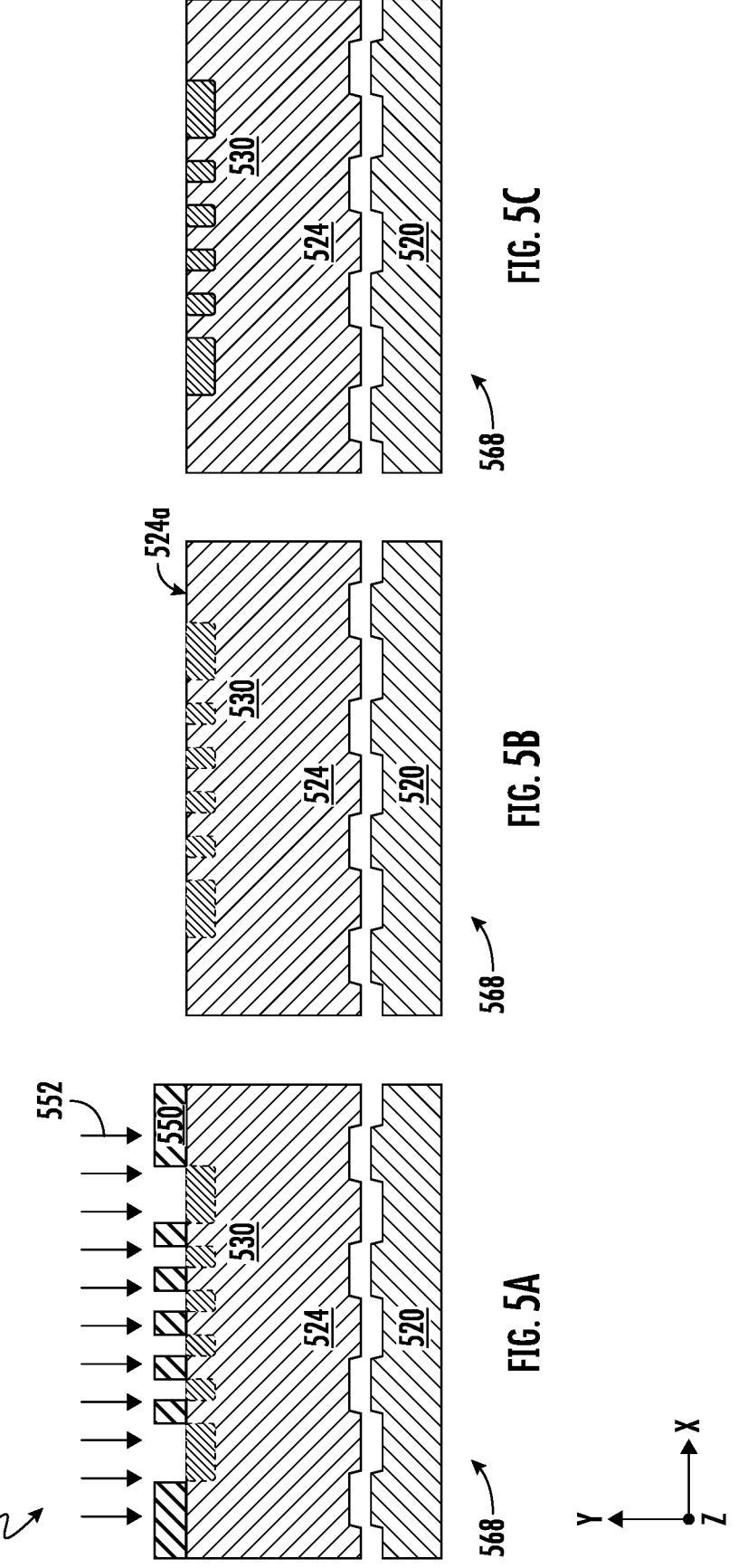

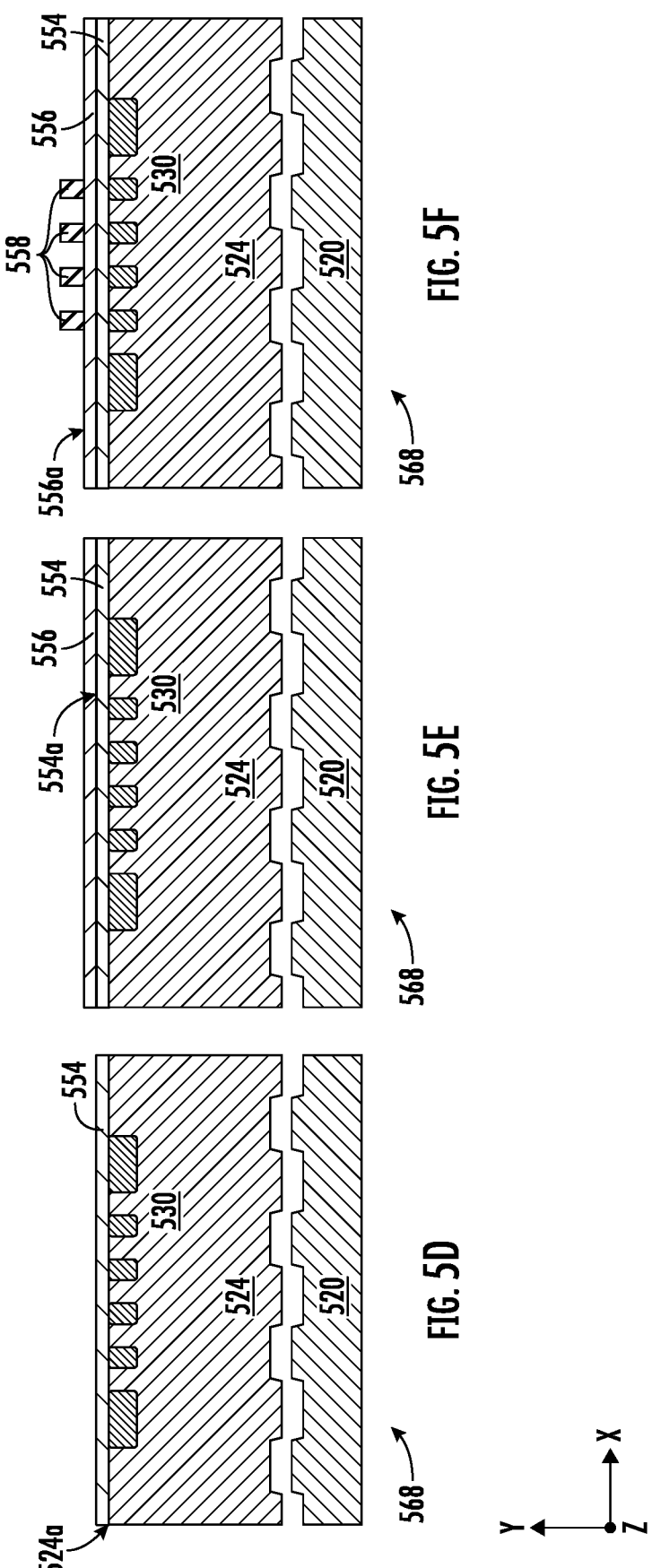

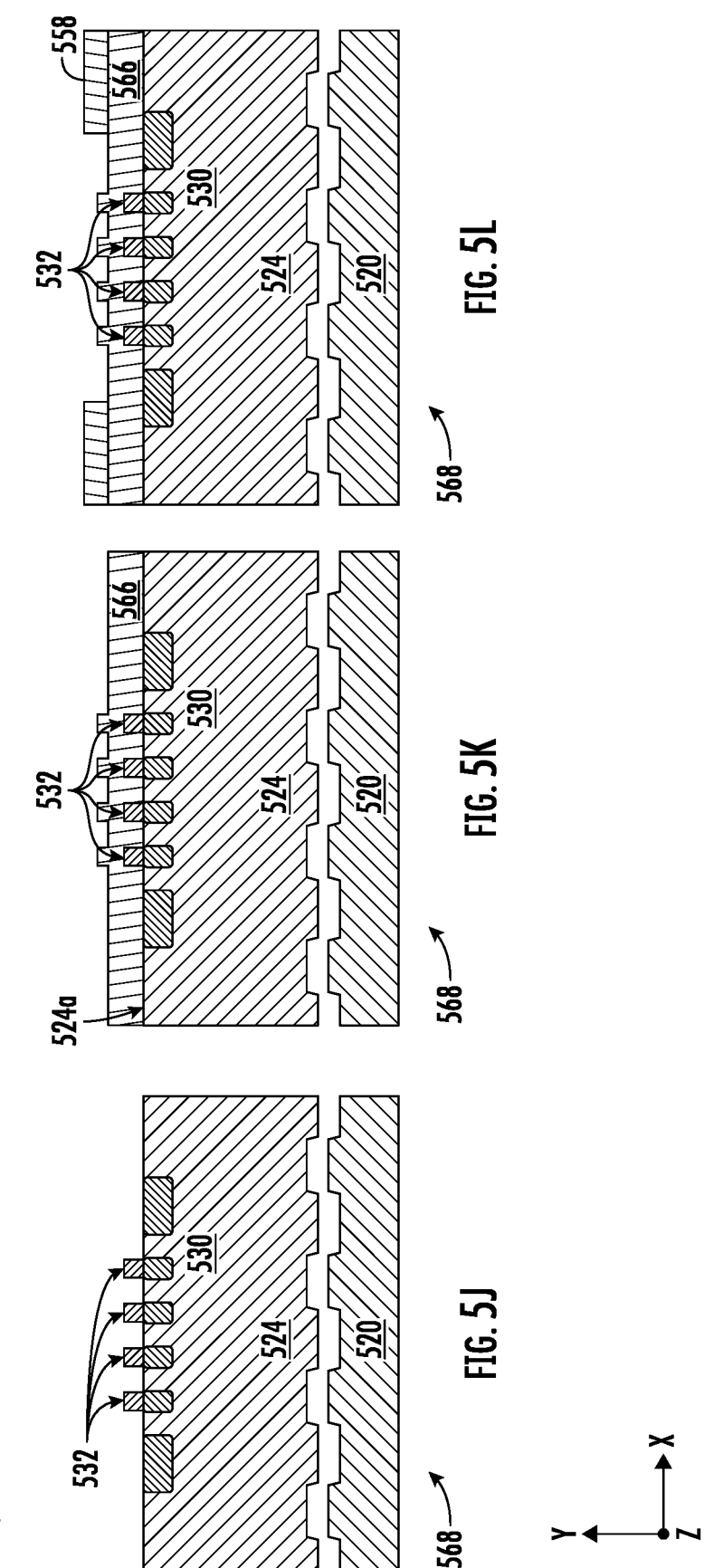

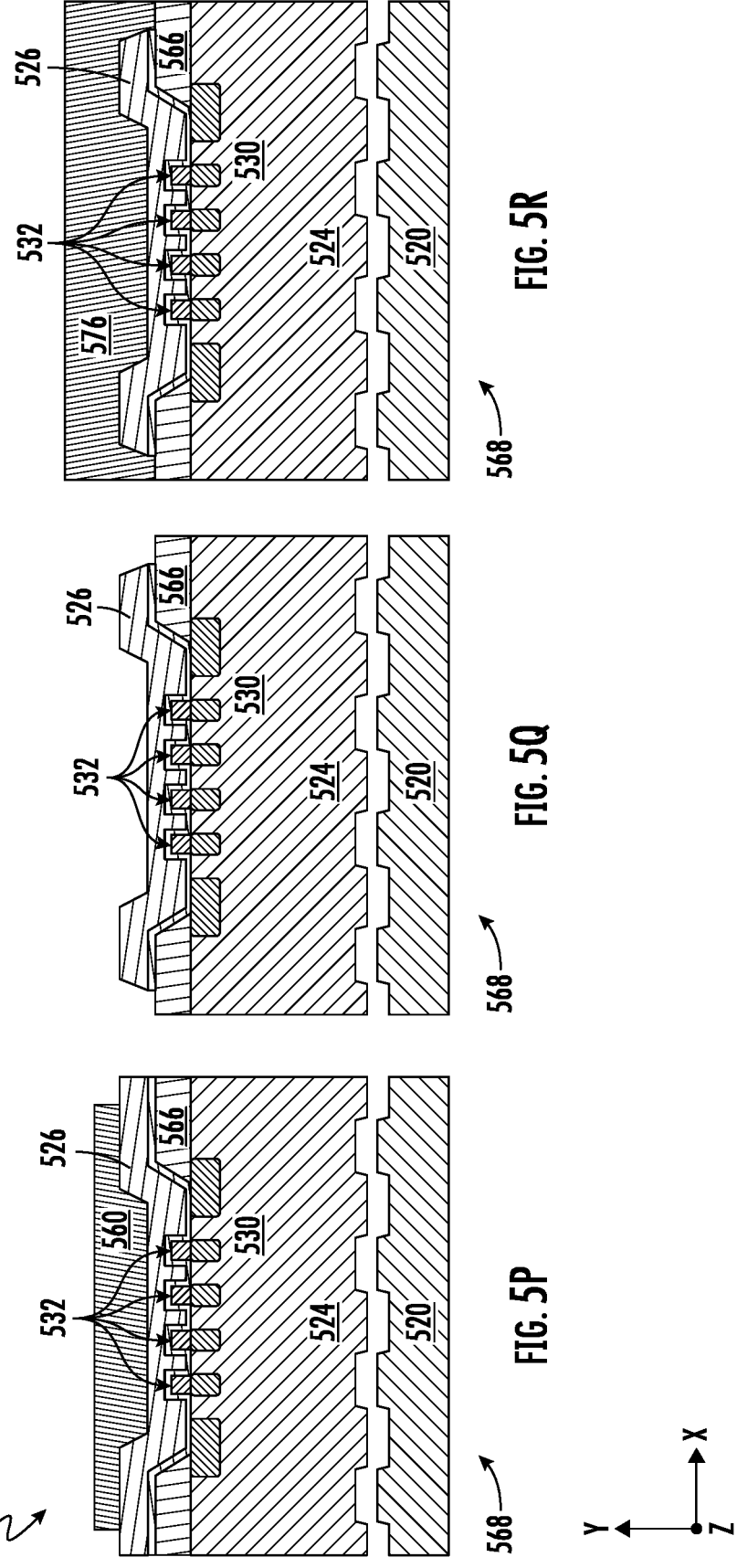

600

602 — REMOVE THE FIRST METAL LAYER

604 — DEPOSIT A FRONT-SIDE METAL ON THE OHMIC CONTACT

606 — REMOVE THE FRONT-SIDE METAL FROM ALL AREAS, EXCEPT A SEMICONDUCTOR COMPONENT AREA ON AND IMMEDIATELY AROUND THE OHMIC CONTACTS

608 — DEPOSIT A PASSIVATION LAYER ON AND AROUND THE FRONT-SIDE METAL

610 — ETCH AN ACCESS CHANNEL TO THE FRONT-SIDE METAL, THROUGH THE PASSIVATION LAYER

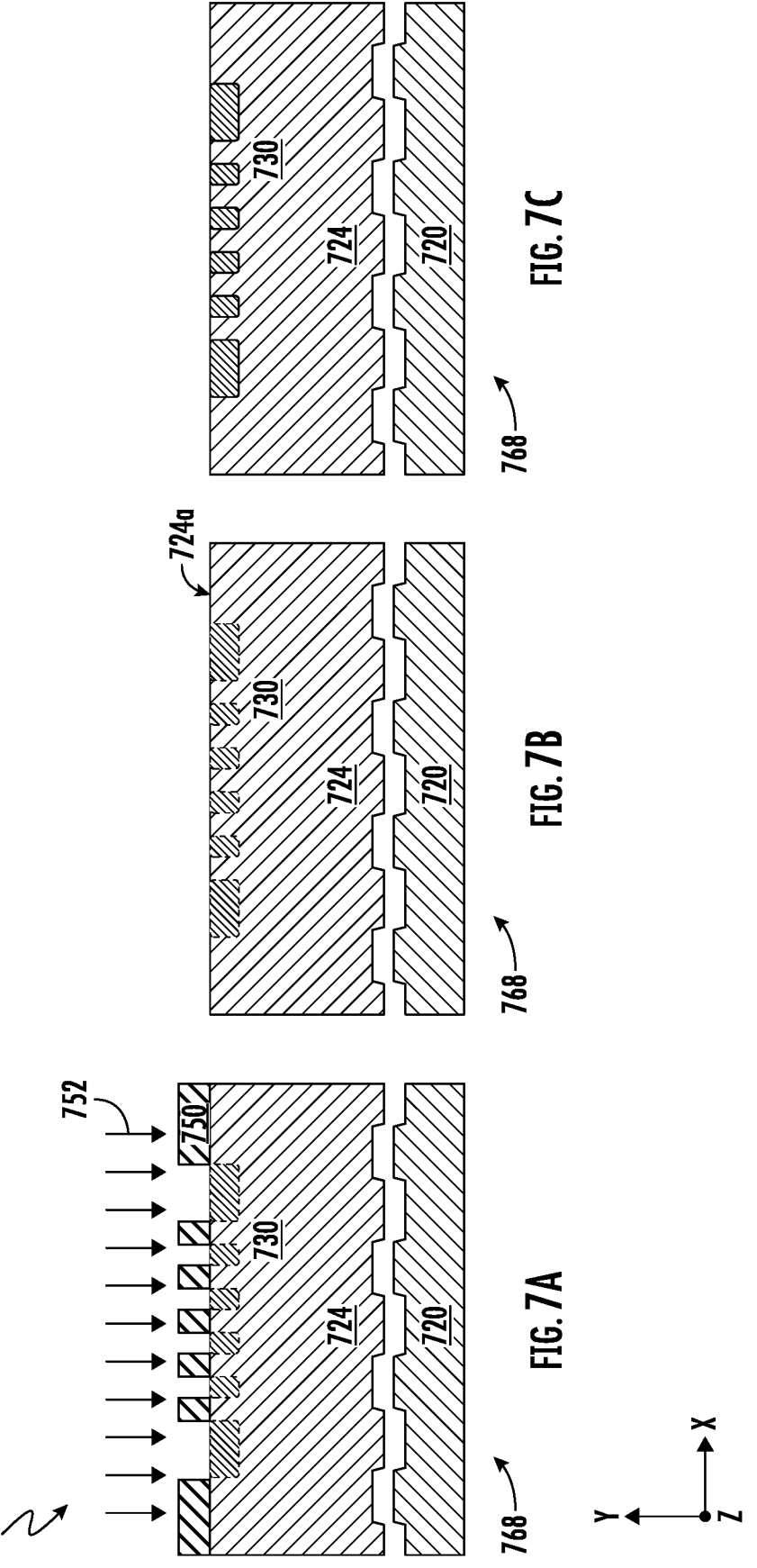

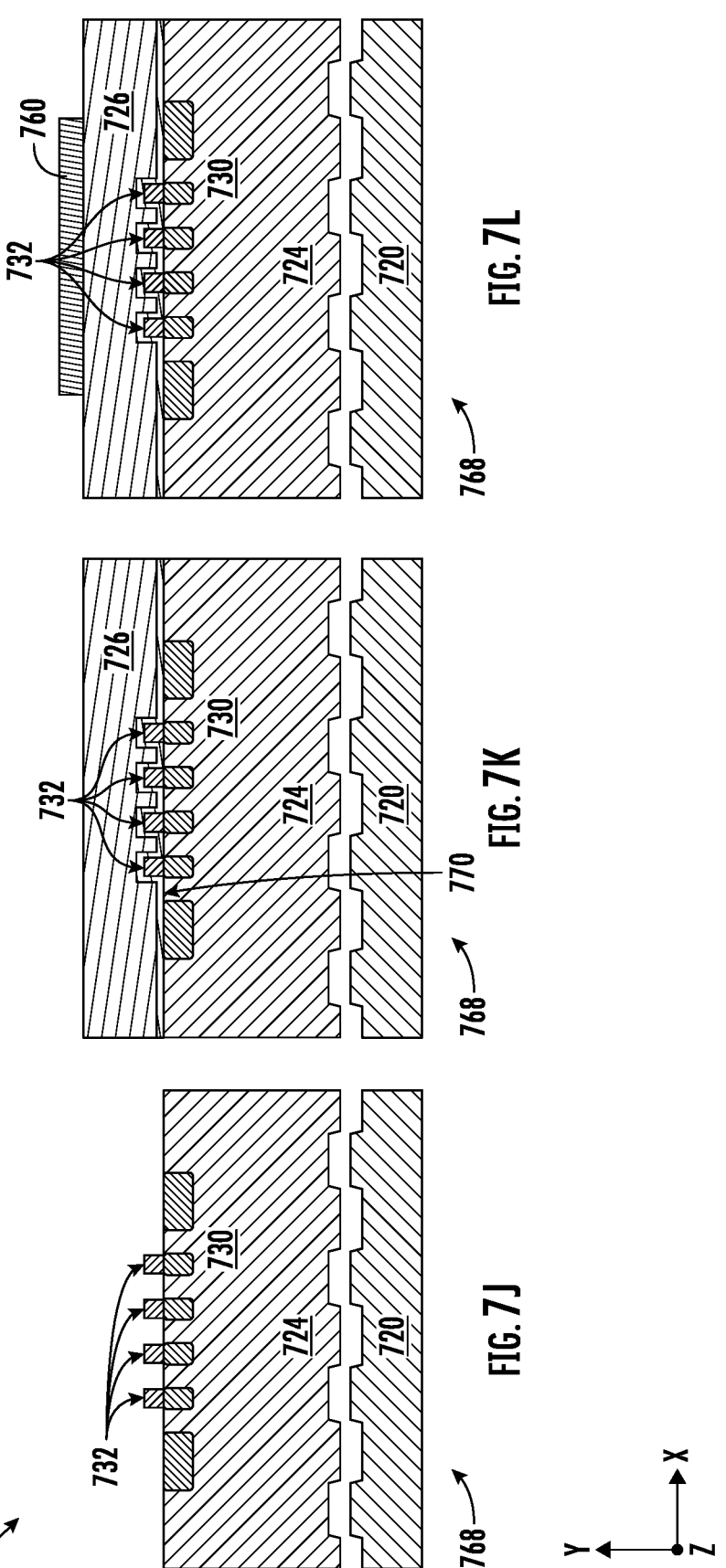

METHOD FOR CREATING AN OHMIC CONTACT ON A HIGH-POWER ELECTRICAL DIODE

TECHNOLOGICAL FIELD

Embodiments of the present disclosure relate generally to creating ohmic contacts on high-power electrical diodes, and more particularly to creating ohmic contacts electrically connecting to the implanted regions of a merged-PN Schottky (MPS) diode.

BACKGROUND

Many semiconductor components, such as MOSFETs, diodes, Schottky devices, and other transistors, require a contact to be formed between semiconductor components and a metal. To improve the efficiency of the semiconductor component, ohmic contacts are most commonly formed. An ohmic contact refers to a type of electrical contact between a metal and a semiconductor material with low resistance and that exhibits linear behavior over a wide range of voltages and currents. Ohmic contacts allow for the efficient transfer of electrical current between metal and semiconductor components.

One particular application utilizing ohmic contacts is a merged-PN Schottky (MPS) diode. Applicant has identified many technical challenges and difficulties associated with the formation of ohmic contacts between a semiconductor and metal. Through applied effort, ingenuity, and innovation, Applicant has solved problems related to the formation of ohmic contacts on high-power electrical diodes, which are described in detail below.

BRIEF SUMMARY

Various embodiments are directed to an example method for forming an ohmic contact on a semiconductor component, for example a high-power electrical diode. In accordance with some embodiments of the present disclosure, an example method is provided. In some embodiments, the example method comprises depositing a first metal layer on a top surface of a semiconductor drift layer comprising an electrical contact point, wherein the first metal layer reflects a laser light. The method further comprises depositing a second metal layer on portions of the first metal layer, wherein the second metal layer is aligned with the electrical contact point, and wherein the second metal layer absorbs the laser light. The method further comprises exposing the first metal layer and the second metal layer to the laser light in a laser annealing process, wherein the second metal layer substantially increases in temperature due to the laser light. In some embodiments, the increase in temperature causes the ohmic contact to form between the electrical contact point and the first metal layer.

In some embodiments, the semiconductor component is a merged-PN Schottky diode.

In some embodiments, the electrical contact point is an implanted well in the top surface of the semiconductor drift layer.

In some embodiments, the portions of the second metal layer are positioned on a top surface of the first metal layer directly opposite the implanted well.

In some embodiments, a first reflectivity of the first metal layer is greater than a second reflectivity of the second metal layer.

In some embodiments, the implanted well comprises a p-type semiconductor and the semiconductor drift layer comprises an n-type semiconductor.

In some embodiments, the ohmic contact forms an electrical contact with the implanted well.

In some embodiments, the method may further comprise removing the second metal layer and depositing a front-side metal on the ohmic contact.

In some embodiments, the front-side metal is an anode of the semiconductor component.

In some embodiments, the method may further comprise removing the front-side metal from all areas, except a semiconductor component area on and immediately around the ohmic contacts.

In some embodiments, the method may further comprise depositing a passivation layer on and around the front-side metal; and etching an access channel to the front-side metal, through the passivation layer.

In some embodiments, the method may further comprise depositing a dielectric layer on the top surface of the semiconductor drift layer and the ohmic contacts, removing the dielectric layer directly above the top surface of the semiconductor drift layer of the semiconductor component, such that the ohmic contacts are exposed, and depositing a front-side metal, on the ohmic contacts and the dielectric layer.

In some embodiments, the method may further comprise removing the front-side metal from all areas, except a semiconductor component area on and immediately around the ohmic contacts.

In some embodiments, the method may further comprise depositing a passivation layer on the surface and immediately around the front-side metal, and etching an access channel to the front-side metal, through the passivation layer.

In some embodiments, the method may further comprise, creating a back-side ohmic contact on the surface opposite the passivation layer, wherein a back-side metal is in electrical contact with the back-side ohmic contact.

In some embodiments, the back-side ohmic contact is a cathode of the semiconductor component.

In some embodiments, the semiconductor drift layer is formed by a process of epitaxial growth on a semiconductor substrate.

In some embodiments, the semiconductor substrate and the semiconductor drift layer both comprise silicon carbide.

In some embodiments, the first metal layer comprises Aluminum.

In some embodiments, the second metal layer comprises Titanium.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

FIG. 3 depicts a flow chart illustrating an example process for forming an ohmic contact on an electrical diode in accordance with one or more embodiments of the present disclosure.

FIG. 4 depicts a flow chart illustrating an example process for forming an ohmic contact on an electrical diode with field plate edge termination in accordance with one or more embodiments of the present disclosure.

DETAILED DESCRIPTION

Figure 1B:
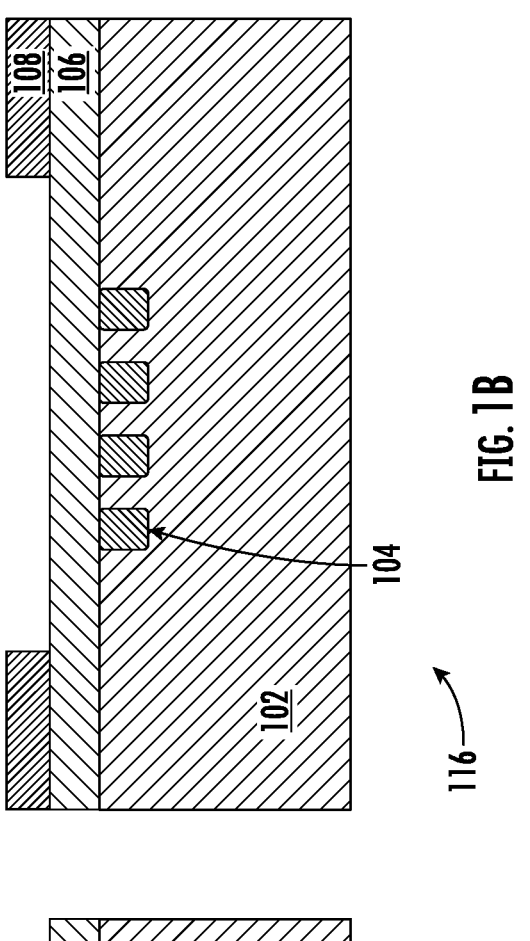
FIG. 1a-FIG. 1g illustrate an example traditional process for creating ohmic contacts on a semiconductor component.

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "behind," "top," "vertical," "horizontal," "above," "below," "over", "under", etc. are used for explanatory purposes in the examples provided below to describe the relative positions of certain components or portions of components relative to a local reference frame of an electrical diode using an arbitrary global reference frame.

In some examples, a Cartesian (triaxial) reference system is provided. Unless otherwise stated, in general, the positive y-direction corresponds to "up," "above," or "on top." Conversely, the negative y-direction corresponds to "down," "below," "under," or "beneath."

Various example embodiments address technical problems associated with forming ohmic contacts on an electrical component. As understood by those of skill in the field to which the present disclosure pertains, there are numerous example scenarios in which ohmic contacts may be formed on an electrical component.

For example, many semiconductor components, such as MOSFETs, power diodes, Schottky diodes, and other transistors, require a contact to be formed between semiconductor components and a metal. To improve the efficiency of the component, ohmic contacts are most commonly formed. An ohmic contact refers to a type of electrical contact between a metal and a semiconductor material with low resistance and that exhibits linear behavior over a wide range of voltages and currents. Ohmic contacts allow for the efficient transfer of electrical current between metal and semiconductor components.

One particular application utilizing ohmic contacts is a merged-PN Schottky (MPS) diode. An MPS diode contains one or more isolated implanted regions (or doped wells) implanted in the Schottky devices drift layer. In general, the implanted regions are of a different conduction type (e.g., p-type) than the drift layer of the MPS diode (e.g., n-type). The implanted regions result in a PN type junction interspersed within the Schottky diode. The result is a diode having the benefits of both a Schottky diode and a PN junction diode. Some of the benefits may include lower leakage current, improved surge current capability at high powers, and improved performance at high frequencies. For improved performance, an ohmic contact may be formed at the junction of the front side contact metal and each of the doped wells of the MPS diode. The placement and efficiency of these ohmic contacts plays an important role in the overall efficiency of the semiconductor component.

Figure 1A:
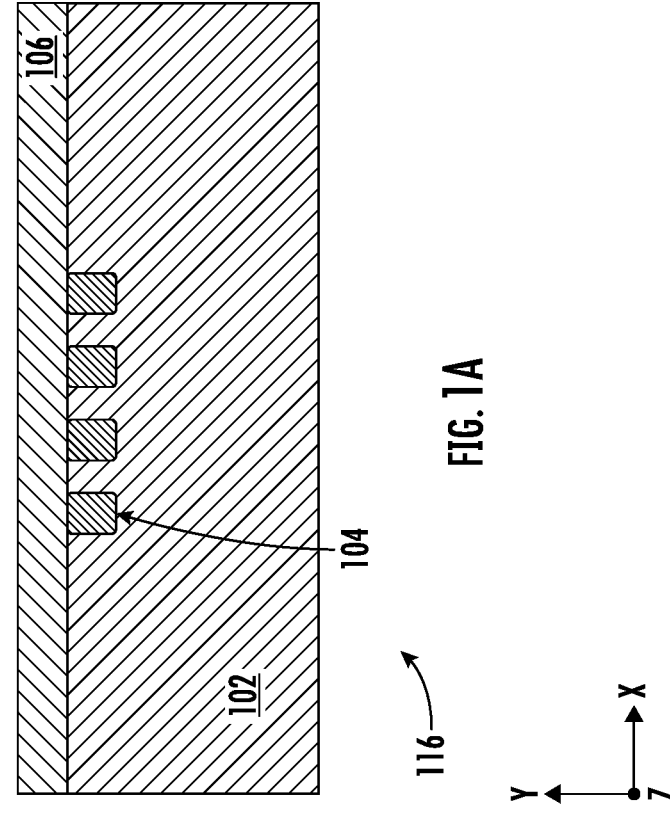

Referring now to FIG. 1a-FIG. 1g, an example traditional process 100 for creating ohmic contacts, is shown. As shown in FIG. 1a, the example traditional process 100 includes disposing a dielectric 106 on the top surface of a drift layer 102 of a semiconductor component 116, wherein the drift layer 102 comprises a plurality of electrical contact points 104 (e.g., doped wells of a MPS diode) to which an electrical connection may be made.

As shown in FIG. 1b, a mask 108 is disposed on the top surface of the dielectric 106 and aligned with the underlying electrical contact points 104 of the semiconductor component 116. Aligning the mask 108 enables the dielectric 106 to be removed directly above the electrical contact points 104 of the semiconductor component 116, as shown in FIG. 1c.

Figures 1C, 1D, 1E:
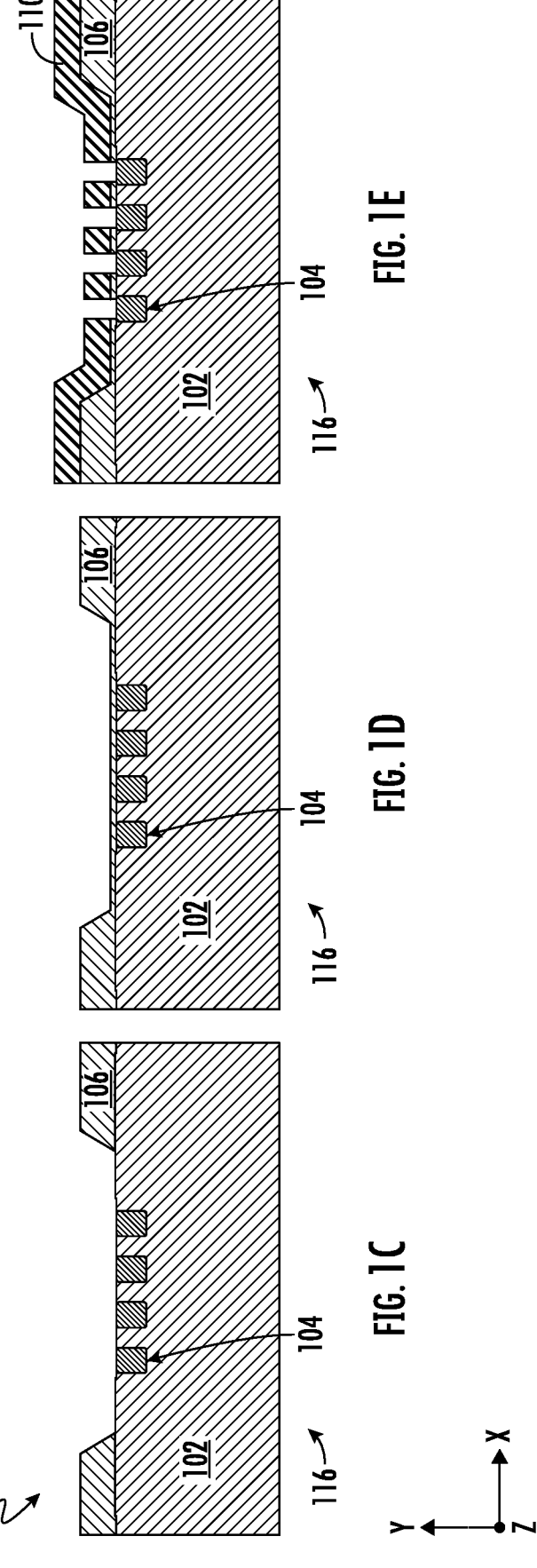

As shown in FIG. 1d, an additional layer of dielectric 106 material is placed on the surface of the semiconductor component 116 such that a thin layer of dielectric covers the exposed portion of the drift layer 102 and the electrical contact points 104 defining the semiconductor component 116, while a thicker layer of dielectric 106 covers the surrounding surfaces.

As shown in FIG. 1e, a mask 110 is deposited on the surface of the dielectric 106, with openings in the mask 110 aligned with the electrical contact points 104 underlying the dielectric 106 layer. The mask 110 enables the dielectric 106 to be etched such that the electrical contact points 104 are exposed.

Figures 1F, 1G:
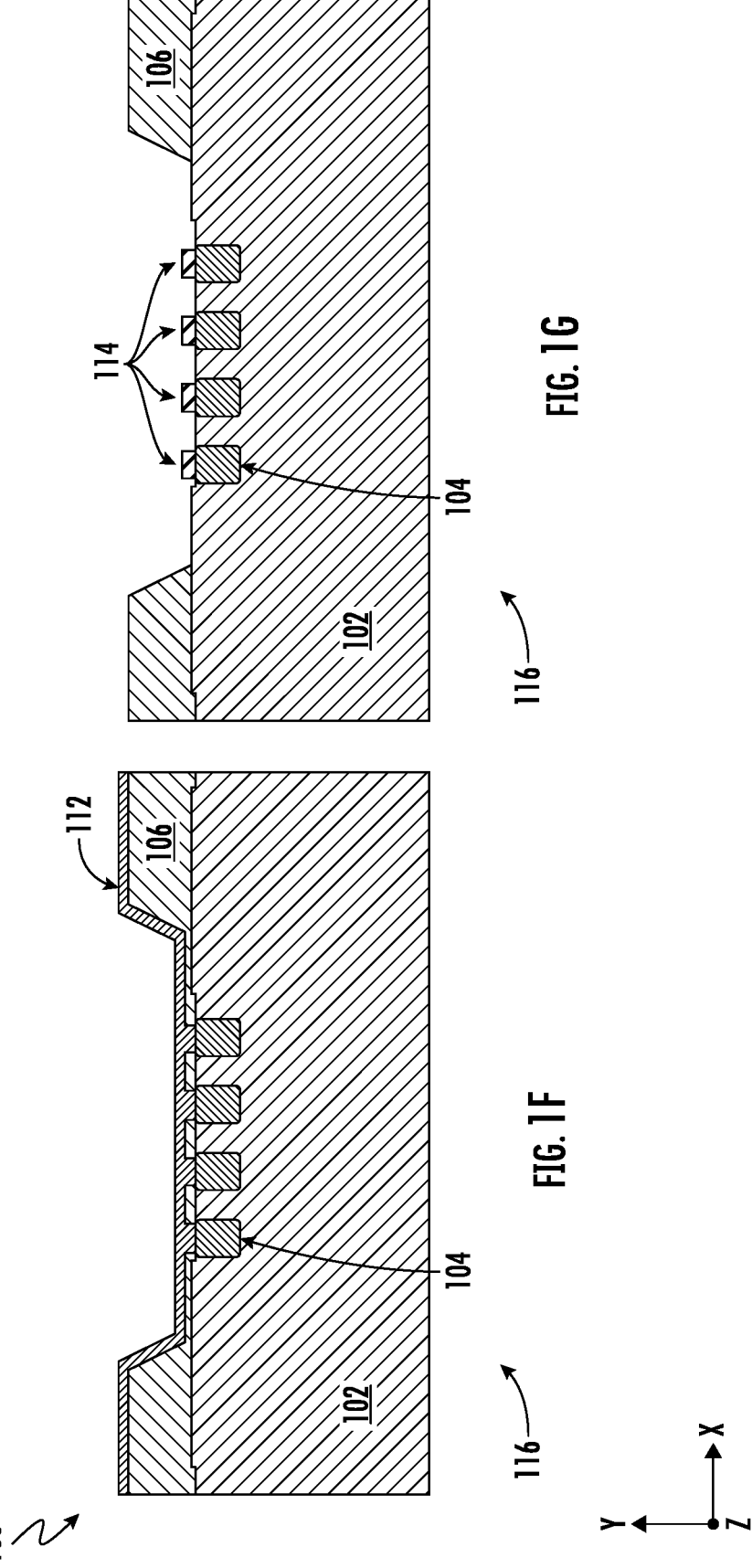

As shown in FIG. 1f, the mask 110 is removed and a contact metal 112 (e.g., Nickel) is deposited on the full surface of the dielectric 106 and an annealing process is performed to create the ohmic contacts. The annealing process generally involves heating the semiconductor component 116 to an annealing temperature at or above 1000° C. Heating the semiconductor component 116 to a high annealing temperature is necessary to enable a reaction between the contact metal 112 and the electrical contact points 104. Heating the semiconductor component 116 to the annealing temperature, may promote the formation of silicides between the doped silicon electrical contact points 104 and the contact metal 112 at the electrical contact points 104. However, high annealing temperatures may cause the contact metal 112 to react with other portions of the semiconductor component 116, making removal of the contact metal 112 difficult and even damaging the underlying layers of the semiconductor component 116.

As shown in FIG. 1g, the contact metal 112 is removed the semiconductor component 116 everywhere except directly above the electrical contact points 104. As further shown in FIG. 1g, the formation of silicides has resulted in ohmic contacts 114 in electrical contact with each of the electrical contact points 104. The removal of the contact metal 112 from the surface of the semiconductor component 116 may be particularly complex. In addition, the removal of the contact metal 112 may negatively affect the underlying layers of the semiconductor component 116.

The traditional process 100 as shown in FIG. 1*a*-FIG. 1*g* may have a number of drawbacks. For example, the formation of the ohmic contact requires an annealing temperature at or above 1000° C. Such high temperatures can be damaging to the underlying structures of the semiconductor component. In addition, the metal layer (e.g., Nickel) used to react with the electrical contact points and promote the growth of silicides must be removed from everywhere not in direct contact with the electrical contact points. The process for removing the metal layer may be complex. Further, these reactions may expand beyond the limits of the electrical contact points and into other areas of the semiconductor component. The expansion of the ohmic contacts into the semiconductor component may have negative effects on the performance of the semiconductor component. This expansion of the ohmic contacts becomes even more problematic as the size of the features of the semiconductor component continues to shrink.

The various example embodiments described herein utilize various techniques to create ohmic contacts to a semiconductor component, such as an MPS diode. For example, in some embodiments, a first metal is deposited on the surface of a semiconductor component having one or more electrical contact points. The first metal may be selected based on the ability of the first metal to reflect light emitted from a laser. In general, the more reflective the first metal is, the less the first metal will heat up when encountered by the laser light.

A second metal may also be deposited on the surface of the first metal. In some embodiments, the second metal may be patterned based on the desired locations for ohmic contacts. For example, the second metal may be placed at locations aligned with the underlying electrical contact points. The second metal may be selected based on the absorption characteristics of the second metal. In general, the more light from the laser the second metal absorbs, the hotter the second metal will become. By strategically patterning the second metal only at desired locations for ohmic contacts, the second metal and underlying portions of the first metal will only significantly increase in temperature at the desired locations for ohmic contacts. The localized increase in temperature may promote reactions between the second metal, the first metal, and the underlying semiconductor contact points, forming silicides at the contact points and creating ohmic contacts to the underlying electrical contact points.

As a result of the herein described example embodiments and in some examples, the complexity of ohmic contact formation, particularly on MPS diodes, may be greatly reduced. In addition, the described example embodiments herein may limit the expansion of ohmic contacts outside of the desired electrical contact points. Limiting the expansion of ohmic contacts may result in higher performing semiconductor components. In addition, limiting the expansion of ohmic contacts may enable ohmic contacts to be formed on semiconductor components having electrical contact points of smaller size and separated by smaller distances.

Figure 2:
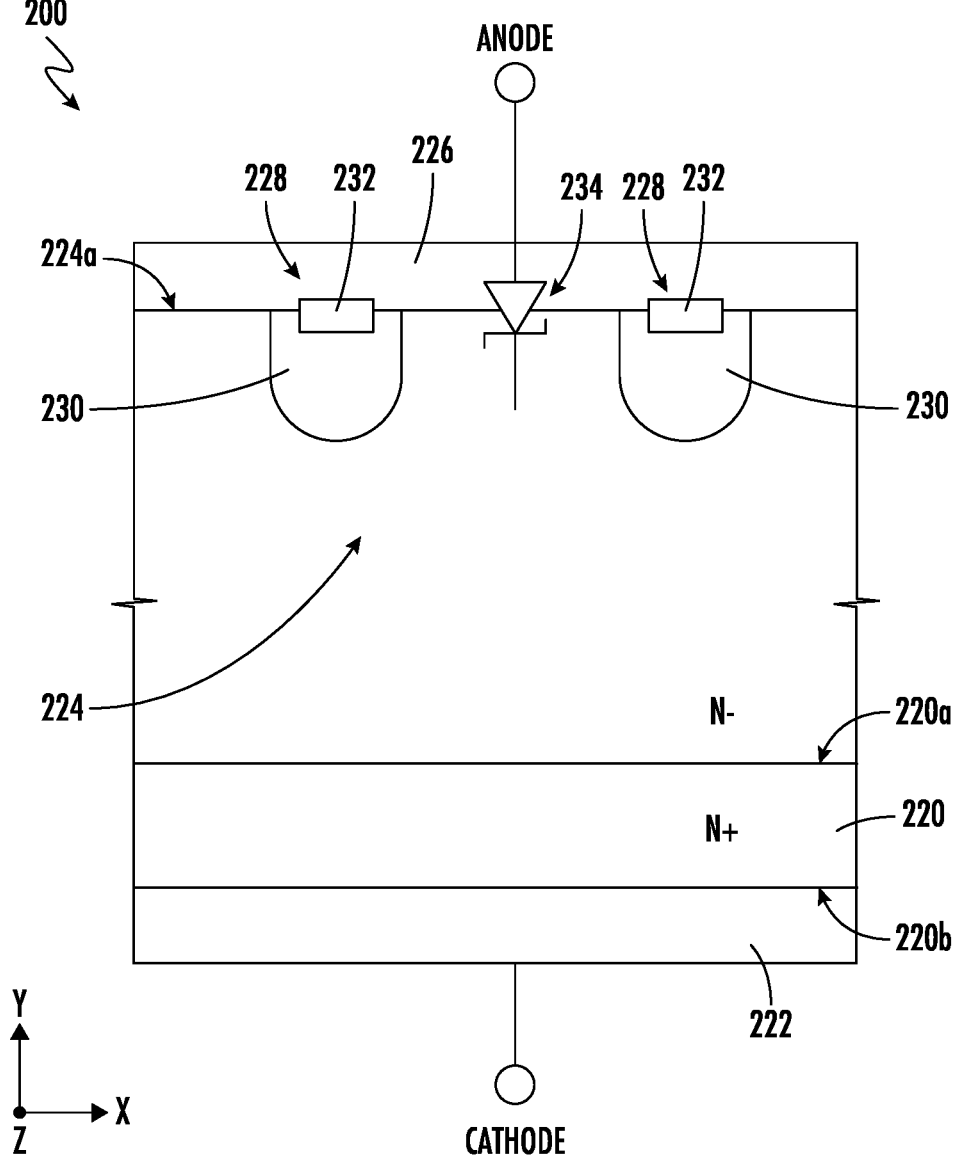
FIG. 2 illustrates a cross-section view of an example merged-PN Schottky (MPS) diode in accordance with one or more embodiments of the present disclosure.

Referring now to FIG. 2, an example merged-PN Schottky (MPS) diode 200 is provided. As depicted in FIG. 2, the example MPS diode 200 includes a substrate 220 having a top surface 220*a* and a bottom surface 220*b* opposite the top surface 220*a*. As further depicted in FIG. 2, the example MPS diode 200 includes a semiconductor drift layer 224 on the top surface 220*a* of the substrate 220, the semiconductor drift layer 224 further including a top surface

224*a* opposite the substrate 220. The MPS diode 200 of FIG. 2 further includes an anode terminal 226 disposed on the top surface 224*a* of the semiconductor drift layer 224, the anode terminal 226 forming a Schottky diode 234 with the top surface 224*a* of the semiconductor drift layer 224. As further depicted in FIG. 2, the MPS diode 200 includes a plurality of junction barrier elements 228 at the junction of the top surface 224*a* of the semiconductor drift layer 224 and the anode terminal 226. Each junction barrier element 228 comprises an implanted well 230 implanted in the top surface 224*a* of the semiconductor drift layer 224 and an ohmic contact 232, forming the electrical connection between the anode terminal 226 and the implanted well 230. The depicted MPS diode 200 further includes a cathode terminal 222 adjacent the bottom surface 220*b* of the substrate 220, opposite the semiconductor drift layer 224.

As depicted in FIG. 2, the example MPS diode 200 includes a substrate 220. A substrate (e.g., wafer) 220 may be any semiconductor material serving as the base layer of a semiconductor component (e.g., MPS diode 200). A substrate 220 may comprise Silicon, Germanium, Gallium Arsenide, Gallium Nitride, Silicon Carbide (SiC), or other similar semiconductor material. A substrate 220 may serve as a base layer for epitaxial growth of additional semiconductor material. Epitaxial growth may be utilized to grow additional crystal layers on the substrate 220, such as the semiconductor drift layer 224.

In some embodiments, the substrate 220 may comprise SiC. SiC may offer a number of advantages in high-power applications. For example, SiC-based semiconductor components may dissipate heat more efficiently, be more tolerant a higher frequencies, have a low reverse leakage current and power dissipation, be more stable across a wide temperature range, have lower electromagnetic radiations, and provide other related advantages.

In some embodiments, the substrate 220 may be doped by a first dopant type to create a semiconductor having a particular conductivity type. A dopant may be any impurity deliberately added to a semiconductor to modify the electrical conductivity of the semiconductor. Adding a dopant to the substrate 220 with extra valence electrons creates a semiconductor with an n-type doping or an n-doped semiconductor. Dopants having extra valence electrons may include Phosphorus, Arsenic, Antimony, etc. Adding a dopant to the substrate 220 with a shortage of valence electrons creates a semiconductor with a p-type doping or a p-doped semiconductor. Dopants having a shortage of valence electrons may include Boron, Aluminum, Gallium, etc. As shown in FIG. 2, the substrate 220 of the example MPS diode 200 is an n-typed semiconductor substrate 220.

In some embodiments, the substrate 220 may comprise a doping concentration. A doping concentration may refer to the number of impurities introduced into the semiconductor substrate 220 structure relative to the number of intrinsic semiconductor atoms. A high doping concentration meaning a larger number of impurities are introduced into the semiconductor substrate 220 relative to the number of intrinsic semiconductor atoms. In some embodiments, the doping concentration of the substrate 220 may be higher than the doping concentration of the semiconductor drift layer 224.

As further depicted in FIG. 2, the example MPS diode 200 includes a semiconductor drift layer 224. A semiconductor drift layer 224 may be any semiconductor material configured to enable the flow of current from the anode terminal 226 to the cathode terminal 222 as a result of the drift of majority carriers. The semiconductor drift layer 224 enables the flow of current from the anode terminal 226 to the cathode terminal 222 when the barrier voltage of the MPS diode 200 is exceeded. Further, the semiconductor drift layer blocks or limits the flow of current in the reverse direction, e.g., from the cathode terminal 222 to the anode terminal. As depicted in FIG. 2, the semiconductor drift layer 224 is of the same dopant type as the substrate 220, e.g., an n-type semiconductor. As further depicted in FIG. 2, the semiconductor drift layer 224 may have a different doping concentration from the substrate 220. For example, the semiconductor drift layer 224 may have a lower doping concentration than the substrate 220.

As further depicted in FIG. 2, the example MPS diode 200 includes an anode terminal 226. The anode terminal 226 may be any conductive material (e.g., front-side metal) through which current enters the MPS diode 200, or equivalently, electrons leave the MPS diode 200. In some embodiments, the anode terminal 226 may comprise a metal, or combination of metals, such as molybdenum, platinum, chromium, tungsten, nickel, or other similar conductive material. In some embodiments, the anode terminal 226 may be disposed atop the junction barrier elements 228 and may provide a conductive path from an external power source to the implanted wells 230 of the MPS diode 200.

As depicted in FIG. 2, the anode terminal 226 may provide a metal contact to the top surface 224a of the semiconductor drift layer 224. The portions of the semiconductor drift layer 224 that contact the anode terminal 226 may create a Schottky diode 234. A Schottky diode 234 may be any semiconductor diode formed by the junction of a semiconductor with a metal. In general, the Schottky diode 234, has a low forward voltage and very fast switching action. Thus, a Schottky diode 234 may be less likely to overheat at high voltages, may allow the transfer of current with higher efficiency, and may perform well at high frequencies.

As further depicted in FIG. 2, the example MPS diode 200 further includes a cathode terminal 222. The cathode terminal 222 may be any conductive material (e.g., back-side metal) through which current exits the MPS diode 200, or equivalently, electrons enter the MPS diode 200. In some embodiments, the cathode terminal 222 may comprise a metal, or combination of metals, such as molybdenum, platinum, chromium, tungsten, nickel, or other similar conductive material. In some embodiments, the cathode terminal 222 may be disposed below the substrate 220, adjacent to the bottom surface 220b of the substrate.

As further depicted in FIG. 2, the MPS diode 200 includes a junction barrier element 228. A junction barrier element 228 may be any portion of the top surface 224a of the semiconductor drift layer 224, that has been altered, or doped, such that a PN junction is formed between the junction barrier element 228, and the semiconductor drift layer 224. In some embodiments, the junction barrier element 228 may include an implanted well 230 (e.g., electrical contact point). The implanted well 230 may comprise a region of the top surface 224a of the semiconductor drift layer 224, that has been doped with a doping agent having a conduction type opposite the semiconductor drift layer 224. As depicted in FIG. 2, the semiconductor drift layer 224 is an n-type doped semiconductor, and the implanted well 230 is a p-type doped semiconductor. In some embodiments, the implanted well 230 may be doped with a higher concentration doping than the surrounding semiconductor drift layer 224.

As further depicted in FIG. 2, the junction barrier element 228 includes an ohmic contact 232 between the anode terminal 226, and the implanted well 230 of the junction barrier element 228. An ohmic contact 232 may be any electrical contact between a metal and a semiconductor that has low contact resistance and linear current-voltage (I-V) behavior. An ohmic contact 232 may be formed by performing an annealing process at the surface of the anode terminal 226 and the implanted well 230. Annealing can create silicides forming an alloy between the semiconductor (e.g., implanted well 230) and the metal (e.g., anode terminal 226) at the junction, which may lower the barrier height.

Referring now to FIG. 3, an example process 300 for forming an ohmic contact (e.g., ohmic contact 114, 232) on a semiconductor component (e.g., semiconductor component 116, MPS diode 200) is provided. At block 302, a first metal layer is deposited on a top surface of a semiconductor drift layer (e.g., semiconductor drift layer 224) comprising an electrical contact point (e.g., implanted well 230), wherein the first metal layer exhibits a high reflectivity (e.g., first reflectivity) characteristic and low absorption with regard to a laser light used in the laser annealing process when compared with the reflectivity characteristic of the second metal layer.

As described herein, a first metal layer comprises any conductive material configured to form an ohmic contact with the underlying semiconductor drift layer of a semiconductor component. In addition, the first metal layer is configured to be highly reflective with regard to a laser light directed toward the first metal layer in the laser annealing process.

For example, as depicted in the embodiments shown in FIG. 5a-FIG. 5u, and FIG. 7a-7r, the first metal layer may comprise aluminum. In some embodiments, the first metal layer may comprise an aluminum compound, such as, silicon-doped aluminum, aluminum silicide, or other similar compound. Aluminum is a highly reflective material, particularly with regard to laser light, such as ultraviolet (UV) lasers. By reflecting the laser light, the temperature of the first metal layer does not increase as substantially when compared with materials that are not as highly reflective.

In some embodiments, the first metal layer may be deposited on the surface of the semiconductor component using physical vapor deposition, chemical vapor deposition, evaporation, sputtering deposition, or another similar process. In some embodiments, the first metal layer may cover the entire surface of the semiconductor component, including electrical contact points such as implanted wells in an MPS diode and other portions of exposed silicon, for example at the semiconductor drift layer. The first metal layer may form an ohmic contact with the underlying highly doped electrical contact points through an annealing or heating process. In such a process, reactions between the first metal layer and the electrical contact points may be induced, for example, the formation of silicides may be induced through an annealing or heating process.

In an instance in which the temperature of the first metal layer is increased at the other portions of exposed silicon, for example at the semiconductor drift layer, undesired reactions may occur between the first metal layer and the underlying semiconductor components. Thus, it is desirable to avoid reactions between the first metal layer and the other portions of exposed silicon, as described with reference to the embodiments herein.

At block 304, a second metal layer is deposited on portions of the first metal layer, wherein the second metal layer is aligned with the electrical contact point, and wherein the second metal layer absorbs the laser light. The second metal layer is selected in part based on a high absorption characteristic, or low reflectivity (e.g., second reflectivity), when exposed to laser light, particularly laser light commonly used in annealing. A second metal layer which absorbs laser light increases in temperature more substantially when compared with a material that is more reflective, such as the first metal layer. Although depicted as titanium in the example embodiments of FIG. 5a-FIG. 5u, and FIG. 7a-FIG. 7r, the second metal layer may comprise any material with a higher absorption rate than the first metal layer that may enable localized heating of the first metal layer at portions in direct contact with the second metal layer.

In some embodiments, the second metal layer may be deposited on portions of the first metal layer. For example, the second metal layer may be aligned with one or more electrical contact points. A semiconductor component may comprise electrical contact points, such as implanted wells, configured to receive electrical contact through an ohmic contact. The portions of the second metal layer aligned with the electrical contact points underlying the first metal layer may enable ohmic contacts to be formed between the first metal layer and the electrical contact points during a laser annealing process.

At block 306, the first metal layer and the second metal layer are exposed to the laser light in a laser annealing process, wherein the second metal layer increases in temperature due to the laser light, and wherein the increase in temperature causes the ohmic contact to form between the electrical contact point and the first metal layer. By positioning the portions of the second metal layer on the first metal layer, such that the portions of the second metal layer are aligned with the electrical contact points underlying the first metal layer, the second metal layer may enable ohmic contacts to be localized to the electrical contact points during a laser annealing process. In an instance in which the surface of the semiconductor component (comprising a first metal layer and portions of the first metal layer covered by a second metal layer) is exposed to the laser light during the laser annealing process, the portions of the second metal layer absorb the laser light and increase in temperature. The increase in temperature of the second metal layer causes the portions of the first metal layer between the second metal layer and the underlying electrical contact points to also increase in temperature, enabling reactions with the underlying electrical contact points. An ohmic contact is formed between the second metal layer, the first metal layer, and the underlying electrical contact points.

Due to the reflective properties of the first metal layer, the portions of the first metal layer that are not in contact with the second metal layer do not increase in temperature as significantly as the portions of the first metal layer that are in contact with the second metal layer. Thus, the first metal layer does not react with the underlying exposed portions of the semiconductor drift layer, such that the ohmic contacts are limited to the portions of the first metal layer underlying the second metal layer.

Referring now to FIG. 4, an example process 400 for manufacturing a power diode utilizing a field plate edge termination structure in accordance with one or more embodiments of the present disclosure is provided. At block 402, the first metal layer is removed. In some embodiments, ohmic contacts may be formed between the portions of the second metal layer, the underlying first metal layer, and the underlying electrical contact points, as described in relation to FIG. 3. The first metal layer may be removed via wet etching, dry etching, or another similar process for removing metal layers on a semiconductor. In some embodiments, the ohmic contacts may be protected using a masking process.

In some embodiments, an etching process may be utilized such that the ohmic contacts remain while the other portions of the first metal layer are removed.

At block 404 a dielectric layer is deposited on the top surface of the semiconductor drift layer and the ohmic contacts. A dielectric layer may be any insulating material configured to electrically isolate portions of the semiconductor component. A dielectric layer may be formed on a semiconductor component through thermal oxidation, through deposition, or another similar process. In some embodiments, the dielectric layer may comprise silicon oxide, silicon nitride, or another similar insulator. In some embodiments, the dielectric may be deposited or grown on the entire surface of the semiconductor component.

At block 406, the dielectric layer directly above the top surface of the semiconductor drift layer of the semiconductor component is removed, such that the ohmic contacts are exposed. In some embodiments, the semiconductor component may be comprise a transmission region wherein electrical contact may be made by an anode terminal and the transmission of current may occur. For example, in an MPS diode (e.g., MPS diode 200), the transmission region may include the junction barrier elements (e.g., junction barrier elements 228) and the areas of contact between the anode terminal (e.g., anode terminal 226) and the semiconductor drift layer (e.g., semiconductor drift layer 224) forming one or more Schottky diodes (e.g., Schottky diode 234). The deposited or grown dielectric layer may be removed such that the transmission region of the semiconductor component is exposed. In some embodiments, the dielectric layer may be removed by masking and etching or other similar process.

At block 408, a front-side metal is deposited on the ohmic contacts and the dielectric layer. As described in relation to FIG. 2, the front-side metal (e.g., anode terminal 226) may be any conductive material through which current enters the semiconductor component, or equivalently, electrons leave the semiconductor component. In some embodiments, the front-side metal may comprise a combination of metals in multiple layers, such as molybdenum, platinum, chromium, tungsten, titanium, nickel, etc. In some embodiments, the front-side metal may be deposited across the surface of the semiconductor component using physical vapor deposition, chemical vapor deposition, evaporation, sputtering deposition, or another similar process. The front-side metal covers the surface of the transmission region, making electrical contact with the exposed semiconductor drift layer and the ohmic contacts.

At block 410, the front-side metal is removed from all areas, except an electrical diode area on and immediately around the ohmic contacts. In some embodiments, the front-side metal remains such that the front-side metal provides electrical contact with the top surface of the semiconductor component, for example, the exposed semiconductor drift layer and the ohmic contacts. Further, the front-side metal may overlap portions of the dielectric layer.

At block 412, a passivation layer is deposited on the surface and immediately around the front-side metal. A passivation layer may comprise any material configured to coat the semiconductor component and protect the semiconductor from corrosion, chemical reactivity, and electrical contacts. A passivation layer may be formed through thermal oxidation or other similar process. In some embodiments, the passivation layer may cover the entire surface of the semiconductor component.

At block 414, an access channel is etched to the front-side metal, through the passivation layer. An access channel may be etched utilizing a mask and wet or dry etching process. The access channel may be any pathway, corridor, wire, or opening enabling access to the conductive front-side metal from outside the passivation layer.

Figures 5G, 5H, 5I:
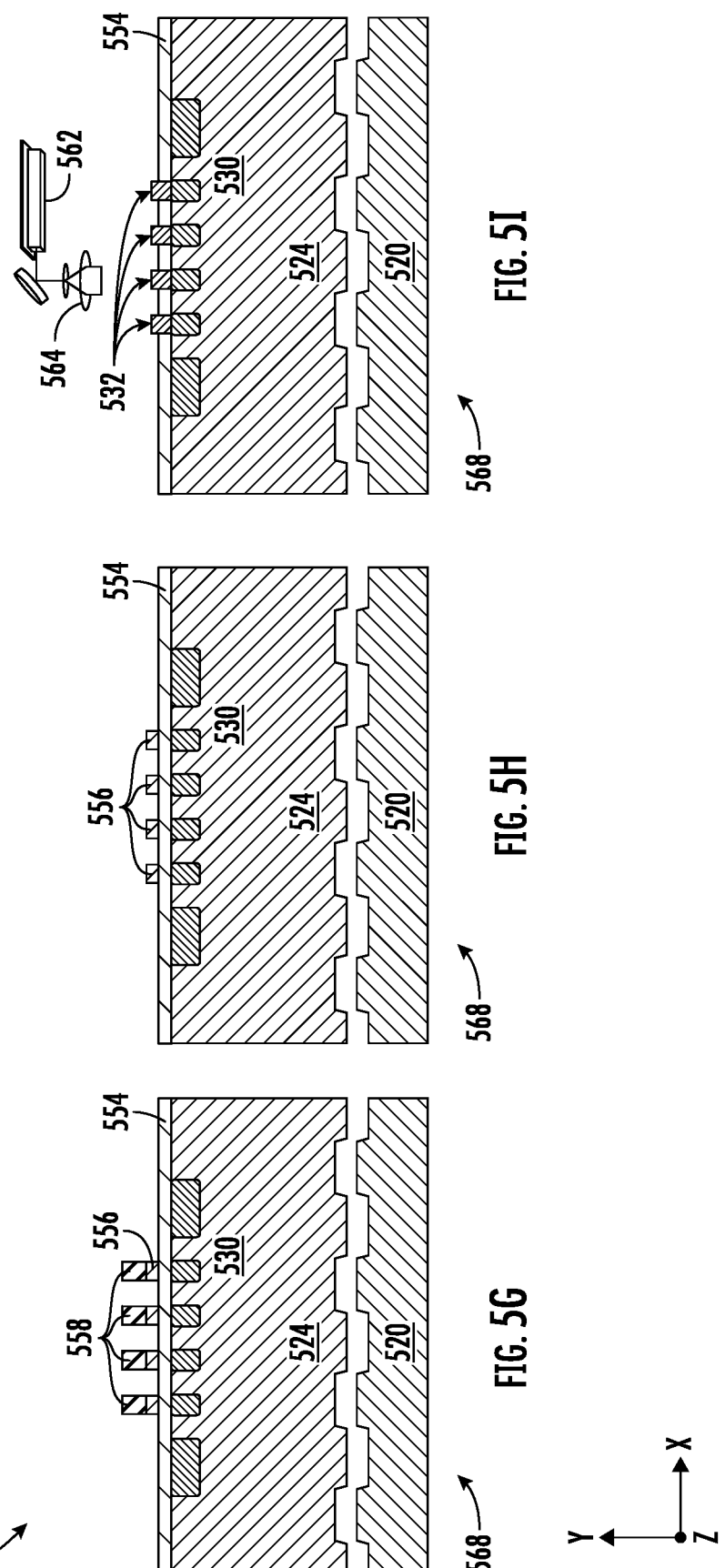
FIG. 5a-FIG. 5u depicts a cross-section view of an example process for manufacturing an MPS diode with field plate edge termination having one or more ohmic contacts formed in accordance with one or more embodiments of the present disclosure.
Figures 5M, 5N, 5O:
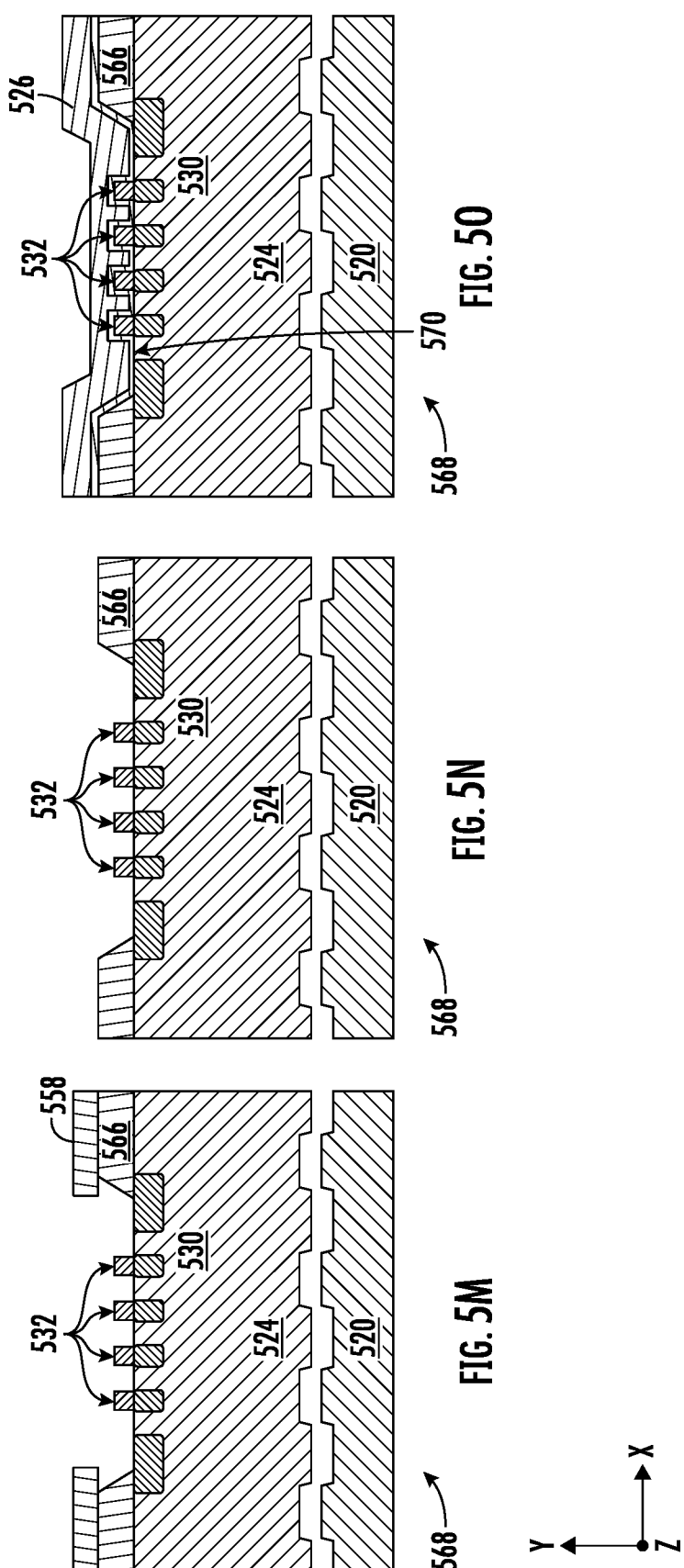
Figures 5S, 5T, 5U:
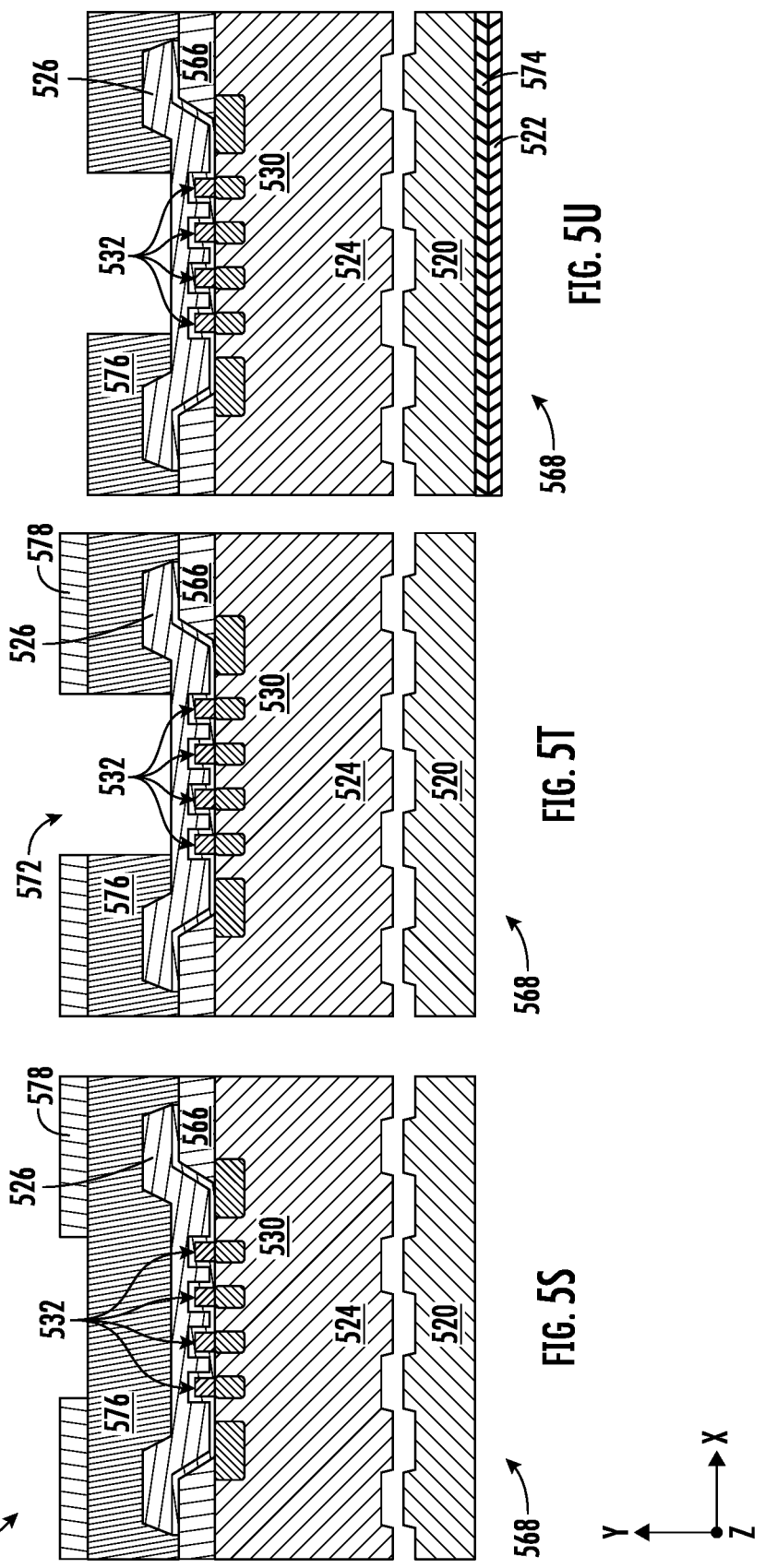

Referring now to FIG. 5a-FIG. 5u, an example process 500 for forming an ohmic contact on an example MPS diode is depicted. The depicted example process 500 of FIG. 5a-FIG. 5u further includes the process for forming a field plate edge termination structure. In FIG. 5a, one or more heavily doped regions (e.g., implanted wells 530) are formed in the surface of a semiconductor drift layer 524 (e.g., semiconductor drift layer 224) of a semiconductor component 568. As shown in FIG. 5a, the heavily doped regions form implanted wells 530. As described in relation to FIG. 1, implanted wells 530 may comprise a region of the top surface 524a of the semiconductor drift layer 524, that has been doped with a p-type doping, opposite the n-type doping of the semiconductor drift layer 224. Further, in some embodiments, the implanted wells 530 may be doped at a higher concentration than the surrounding semiconductor drift layer 524. The semiconductor drift layer 524 may be formed by an epitaxial growth process on the substrate 520. The substrate 520 comprises an n-type semiconductor, just as the semiconductor drift layer 524. In some embodiments, the substrate 520 may be doped at a higher concentration than the semiconductor drift layer 524. In some embodiments, both the substrate 520 and the semiconductor drift layer 524 may comprise silicon carbide. Silicon carbide may be particularly beneficial in high-power and/or high-frequency devices.

The implanted wells 530 may be formed by a process of ion implantation 552 as shown in FIG. 5a. The implanted wells 530 are defined by a mask 550 blocking implantation of ions except in the implanted wells 530 and guard ring forming the peripheral of the semiconductor component 568. The implanted wells 530 form a PN junction type diode with the semiconductor drift layer 524. In an MPS diode, the implanted wells 530 may alleviate some of the stress placed on the diode under high power. The implanted wells 530 may carry some of the current through the diode when the power is high. Without the implanted wells 530, a pure Schottky diode may be overstressed and enter into thermal runaway. Thus, the implanted wells 530 enable the MPS diode to reap some of the benefits of both a Schottky diode and a PN diode.

Referring now to FIG. 5b, the mask 550 is removed from the top surface 524a of the semiconductor drift layer 524.

As depicted in FIG. 5c, the semiconductor component 568 is subjected to an annealing process to activate the dopants in the implanted wells 530 in the semiconductor drift layer 524. The annealing process may include exposing the semiconductor component 568 to a high temperature and allowing the semiconductor component 568 to cool slowly. Such an annealing process may fix the implanted ions in lattice sites of the semiconductor drift layer 524 structure. In some embodiments, damage from the implantation of ions may be repaired during this process.

As depicted in FIG. 5d, an aluminum layer (e.g., first metal layer) 554 is deposited on the semiconductor component 568. The aluminum layer 554 may be deposited on the top surface 524a of the semiconductor drift layer 524 by a process such as physical vapor deposition, chemical vapor deposition, evaporation, sputtering deposition, or other similar process. As described herein, aluminum may be selected as the first metal layer because aluminum reflects laser light. Thus, there is no significant increase in temperature to the aluminum layer 554 when exposed to laser light in an annealing process. Due to the reflective nature of the aluminum, the underlying components are protected during a laser annealing process. In addition, aluminum may be caused to react with the underlying implanted wells 530 to create ohmic contacts (e.g., ohmic contacts 532 as shown in FIG. 5i).

As depicted in FIG. 5e, a titanium layer 556 is deposited on the top surface 554a of the aluminum layer 554. The titanium layer 556 may be deposited on the top surface 554a of the aluminum layer 554 by a process such as physical vapor deposition, chemical vapor deposition, evaporation, sputtering deposition, or other similar process. As described herein, titanium may be selected as the second metal layer based at least in part based on titanium's absorption of laser light. Due to the absorption by titanium of laser light when exposed to a laser light source, the titanium layer 556 will increase in temperature when exposed to a laser light source.

As depicted in FIG. 5f, a mask 558 is deposited on the top surface 556a of the titanium layer 556. The mask 558 protects the portions of the titanium layer 556 under the mask 558 from being removed during etching or another process utilized to remove the titanium layer 556. As depicted in FIG. 5f, the mask 558 is aligned with the implanted wells 530 underlying the aluminum layer 554.

As depicted in FIG. 5g, the titanium layer 556 of the semiconductor component 568 is removed from the surface of the semiconductor component 568, except where the titanium layer 556 is protected by the mask 558.

As depicted in FIG. 5h, the mask 558 is removed from the semiconductor component 568, leaving only the portions of the titanium layer 556 protected by the mask 558 on the surface of the aluminum layer 554. As depicted in FIG. 5h, the remaining portions of the titanium layer 556 are aligned with the implanted wells 530 implanted in the semiconductor drift layer 524 beneath the aluminum layer 554.

As depicted in FIG. 5i, a laser 562 directs laser light 564 across the surface of the semiconductor component 568 in a laser annealing process. A laser annealing process may be utilized to heat the portions of the semiconductor component 568 which are configured to absorb the laser light 564 (e.g., the portions of the titanium layer 556). By generating laser light 564 having a wavelength absorbed by the titanium layer 556 but reflected by the aluminum layer 554, the temperature increases at the remaining portions of the titanium layer 556 and the underlying portions of the aluminum layer 554 in contact with the titanium layer 556. However, the portions of the aluminum layer 554 not in contact with the titanium layer 556 reflect the laser light 564 and do not substantially increase in temperature. In some embodiments, a laser 562 emitting ultraviolet (UV) laser light 564 is utilized to perform the laser annealing process. In such an embodiment, the wavelength of the UV laser light 564 may be between 290 nanometers and 370 nanometers; preferably between 300 nanometers and 360 nanometers; more preferably between 310 nanometers and 350 nanometers. In some embodiments, the titanium layer 556 may begin to increasingly reflect laser light 564 as wavelengths move above 370 nanometers. The increased reflectance may mean that less laser light 564 is absorbed by the titanium layer 556 and the titanium layer 564 does not reach sufficient temperatures to facilitate the formation of ohmic contacts 532.

The increase in temperature of the titanium layer 556 and underlying portions of the aluminum layer 554 enable reactions to occur between the titanium layer 556, the aluminum layer 554, and the implanted wells 530. The reactions create ohmic contacts 532 between the titanium of the titanium layer 556, the aluminum of the aluminum layer 554, and the implanted wells 530 of the semiconductor drift layer 524. Such a titanium/aluminum ohmic contact is one of the best known ohmic contacts for p-type or n-type implanted regions. Because the increase in temperature is localized based on the location of the titanium layer 556 portions, the portions of the aluminum layer 554 that do not substantially increase in temperature, do not react with the underlying semiconductor.

As depicted in FIG. 5j, the aluminum layer 554 is removed from the surface of the semiconductor component 568, leaving the ohmic contacts 532 formed by the titanium layer 556 and underlying aluminum layer 554 intact above the implanted wells 530.

As depicted in FIG. 5k, a dielectric layer 566 is formed through thermal oxidation, deposition, or other similar process on the top surface 524a of the semiconductor drift layer 524, including the ohmic contacts 532.

As depicted in FIG. 5l, a mask 558 is disposed on top of the dielectric layer 566, such that the portions of the dielectric layer 566 directly above the semiconductor component 568, including the ohmic contacts 532 are open to exposure. As depicted in FIG. 5l, the mask 558 is aligned with the p-type doped guard ring, indicating the peripheral extent of the semiconductor component 568.

As depicted in FIG. 5m, the dielectric layer 566 is removed directly above the semiconductor component 568 including the ohmic contacts 532. As depicted in FIG. 5m, the dielectric layer 566 remains over portions of the semiconductor outside of the semiconductor component 568 as indicated by the p-type doped guard ring. At least a portion of the dielectric layer 566 overlaps the guard ring at the outer extent of the semiconductor component 568. The dielectric layer 566 at the edge of the semiconductor component 568 at least partially forms the field plate edge termination structure with the front-side metal 526 as shown in FIG. 5o.

As depicted in FIG. 5n, the mask 558 is removed from the surface of the dielectric layer 566.

As depicted in FIG. 5o, a front-side metal 526 (e.g., anode terminal 226) is deposited on the surface of the semiconductor component 568. As described in relation to FIG. 2, the front-side metal 526 may be any conductive material through which current enters the semiconductor component 568, or equivalently, electrons leave the semiconductor component 568. In some embodiments, the front-side metal 526 may comprise a metal, or combination of metals, such as molybdenum, platinum, chromium, tungsten, nickel, or other similar conductive material. As depicted in FIG. 5o, the front-side metal 526 is disposed on top of the ohmic contacts 532 and provides a conductive path from an external power source to the implanted wells 530 of the semiconductor component 568. The front-side metal 526 further creates a Schottky junction 570 between the front-side metal 526 and the semiconductor drift layer 524.

As depicted in FIG. 5p, a mask 560 is deposited on the surface of the front-side metal 526. The mask 560 defines the outer dimensions of the front-side metal in relation to the semiconductor component 568. As shown in FIG. 5p, the mask 560 overlaps at least a portion of the dielectric layer 566 under the front-side metal 526.

As depicted in FIG. 5q, the portions of the front-side metal 526 unprotected by the mask 560 are removed from the surface of the dielectric layer 566. As further depicted in FIG. 5q, the mask 560 is removed from the surface of the front-side metal 526. As depicted, the front-side metal 526 at least partially overlaps with the dielectric layer 566. The front-side metal 526 along with the dielectric layer 566 defining the peripheral edge of the semiconductor component 568 forms the field plate edge termination structure. In some embodiments, the field plate edge termination structure may create a highly resistive region and reduce electric field crowding near the edge of the semiconductor compo-nent 568. Reducing electric field crowding near the edge of the semiconductor component 568 may reduce stress on portions of the semiconductor component 568.

As depicted in FIG. 5r, a passivation layer 576 is depos-ited across the surface of the semiconductor component 568, including the front-side metal 526 and portions of the exposed dielectric layer 566.

As described in relation to FIG. 4, a passivation layer 576 may comprise any material configured to coat the semicon-ductor component 568 so as to protect the semiconductor component 568 from corrosion, chemical reactivity, and electrical contacts. A passivation layer 576 may be formed through thermal oxidation or another similar process.

As depicted in FIG. 5s, a mask 578 is placed on the surface of the passivation layer 576. The mask 578 is aligned with the surface of the front-side metal 526, so as to define a path to the surface of the front-side metal 526 through the passivation layer 576.

As depicted in FIG. 5t, an access channel 572 is etched through the passivation layer 576, to the front-side metal 526. The access channel 572 provides an opening through the passivation layer 576 enabling access to the conductive front-side metal 526 from outside the passivation layer 576.

As depicted in FIG. 5u, the mask 578 is removed from the surface of the passivation layer 576. As further depicted in FIG. 5u, a back-side ohmic contact 574 is formed on the bottom surface of the substrate 520. In addition, a back-side metal 522 (e.g., cathode terminal 222) is disposed on the surface of the back-side ohmic contact 574.

The resulting semiconductor component 568, as shown in FIG. 5u, is an MPS diode with field plate edge termination.

Figure 6:
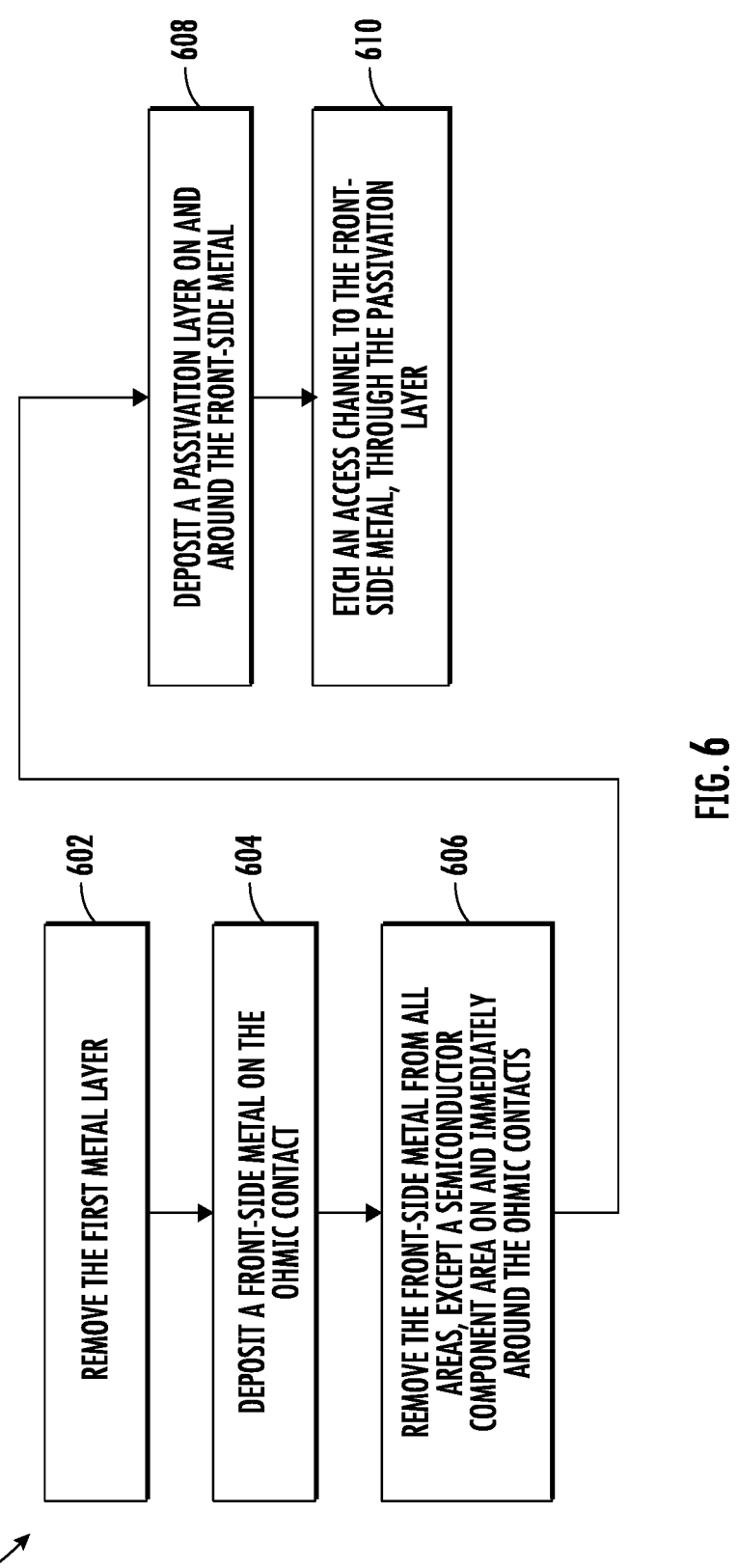
FIG. 6 depicts a flow chart illustrating an example process for forming an ohmic contact on an electrical diode without field plate edge termination in accordance with one or more embodiments of the present disclosure.

Referring now to FIG. 6, an example process 600 for manufacturing a power diode without a field plate edge termination structure in accordance with one or more embodiments of the present disclosure is provided. At block 602, the first metal layer is removed. As described in relation to block 402 of FIG. 4, ohmic contacts may be formed between the portions of the second metal layer, the under-lying first metal layer, and the underlying electrical contact points. The first metal layer may be removed via wet etching, dry etching, or another similar process for removing metal layers on a semiconductor.

At block 604, a front-side metal is deposited on the ohmic contact. As described in relation to FIG. 2, the front-side metal (e.g., anode terminal 226) may be any conductive material through which current enters the semiconductor component, or equivalently, electrons leave the semiconduc-tor component. In some embodiments, the front-side metal may comprise a combination of metals in multiple layers, such as molybdenum, platinum, chromium, tungsten, nickel, titanium, etc. As further depicted in the process 600, the front-side metal is deposited across the surface of the semiconductor. The front-side metal may be deposited using physical vapor deposition, chemical vapor deposition, evaporation, sputtering deposition, or another similar pro-cess. The front-side metal covers the surface of the trans-mission region, making electrical contact with the exposed semiconductor drift layer and the ohmic contacts, as well as other semiconductor regions outside the semiconductor component.

At block 606, the front-side metal is removed from all areas, except a semiconductor component area on and imme-diately around the ohmic contacts. In some embodiments, the front-side metal remains such that the front-side metal provides electrical contact with the top surface of the semiconductor component, for example, the exposed semiconductor drift layer and the ohmic contacts. However, the front-side metal is removed beyond the extent of the semiconductor component.

At block 608, a passivation layer is deposited on and around the front-side metal. A passivation layer may comprise any material configured to coat the semiconductor component and protect the semiconductor from corrosion, chemical reactivity, and electrical contacts. A passivation layer may be formed through thermal oxidation or other similar process. In some embodiments, the passivation layer may cover the entire surface of the semiconductor component.

At block 610, an access channel is etched to the front-side metal, through the passivation layer. An access channel may be etched utilizing a mask and wet or dry etching process. The access channel may be any pathway, corridor, wire, or opening enabling access to the conductive front-side metal from outside the passivation layer.

Figures 7D, 7E, 7F:
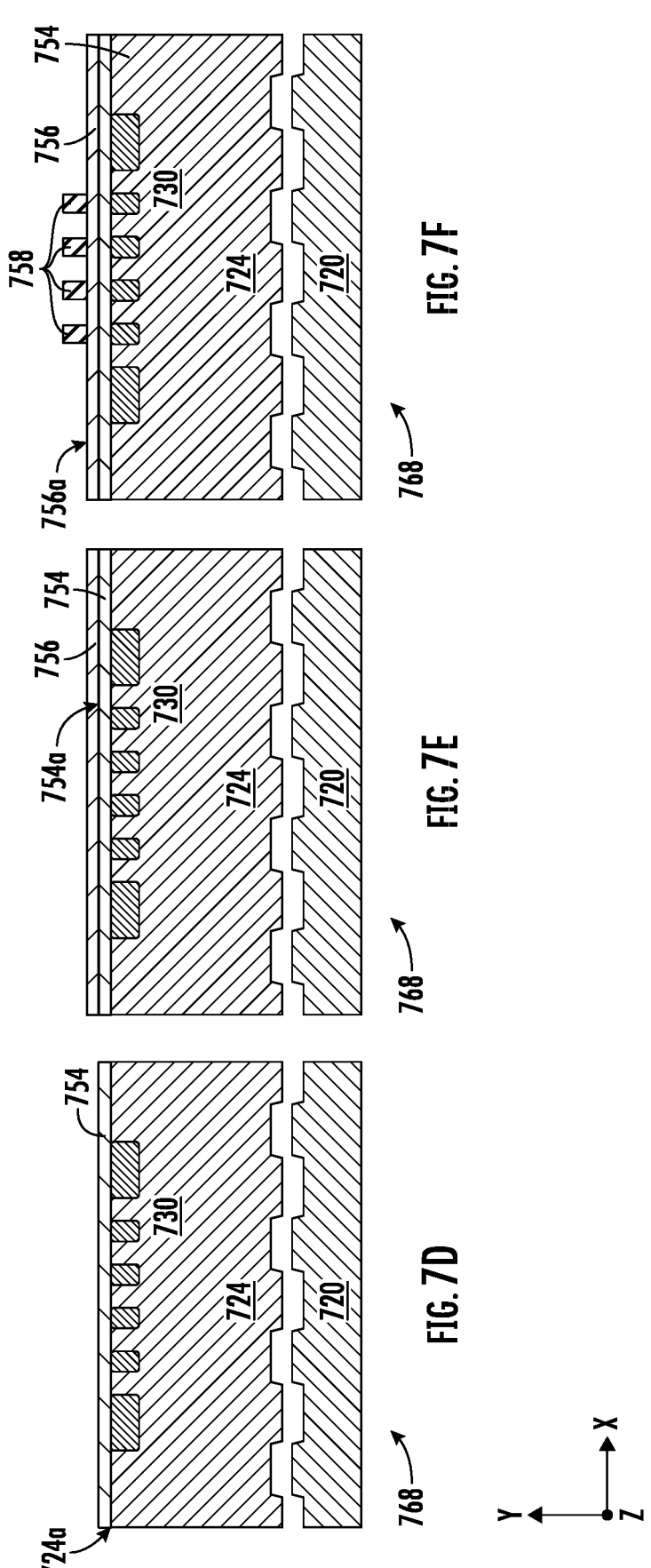
FIG. 7a-FIG. 7r depict a cross-section view of an example process for manufacturing an MPS diode without field plate edge termination having one or more ohmic contacts formed in accordance with one or more embodiments of the present disclosure.
Figures 7G, 7H, 7I:
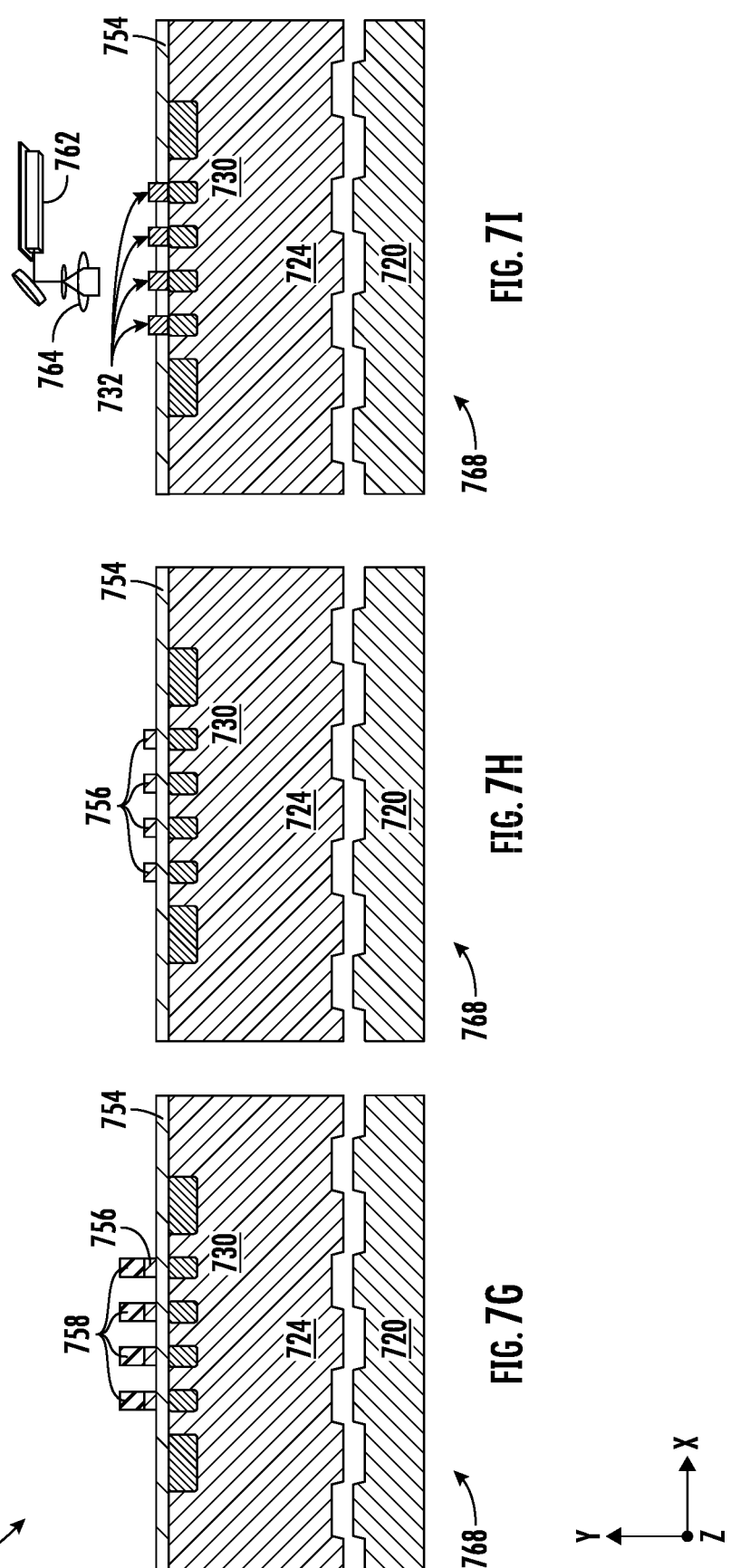
Figures 7M, 7N, 7O:
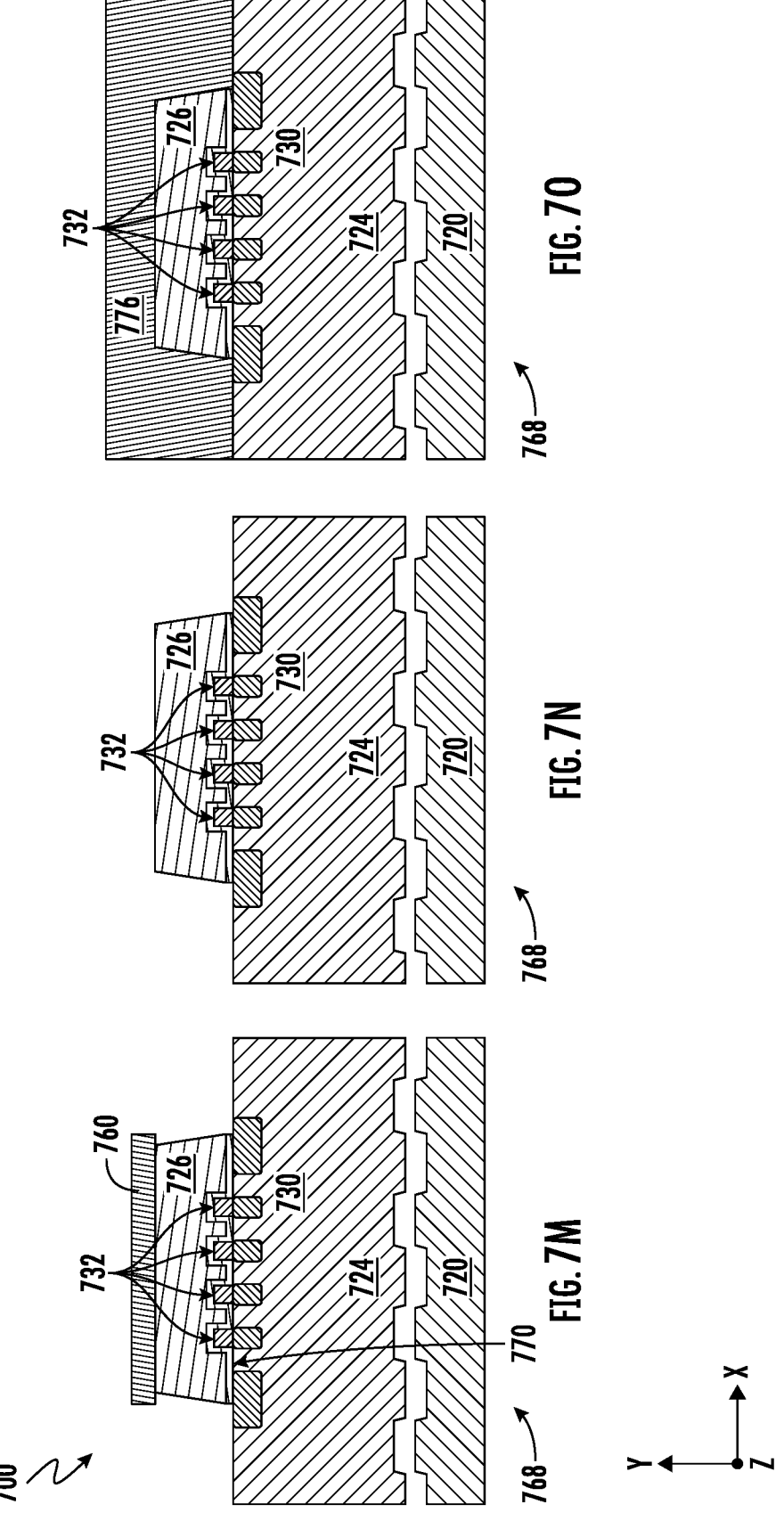
Figures 7P, 7Q, 7R:
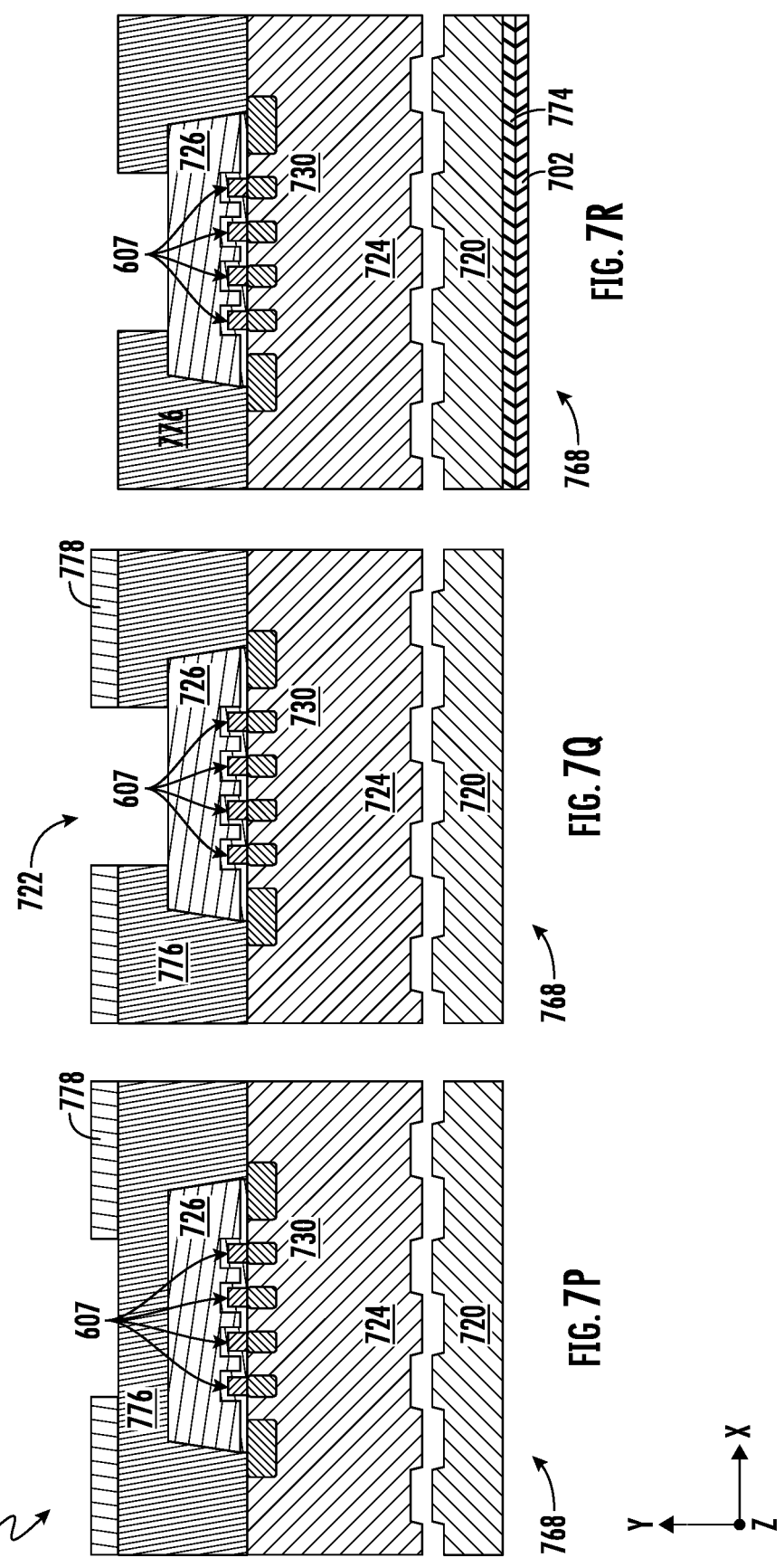

Referring now to FIG. 7a-FIG. 7r, an example process 700 for forming an ohmic contact on an example MPS diode is depicted. The depicted example process 700 of FIG. 7a-FIG. 7r depicts the process of creating an MPS diode without forming a field plate edge termination structure. In FIG. 7a, one or more heavily doped regions (e.g., implanted wells 730) are formed in the surface of a semiconductor drift layer 724 (e.g., semiconductor drift layer 224, 524) of a semiconductor component 768. As shown in FIG. 7a, the heavily doped regions form implanted wells 730. As described in relation to FIG. 1, implanted wells 730 may comprise a region of the top surface 724a of the semiconductor drift layer 724, that has been doped with a p-type doping, opposite the n-type doping of the semiconductor drift layer 724. Further, in some embodiments, the implanted wells 730 may be doped at a higher concentration than the surrounding semiconductor drift layer 724. The semiconductor drift layer 724 may be formed by an epitaxial growth process on the substrate 720. The substrate 720 comprises an n-type semiconductor, just as the semiconductor drift layer 724. In some embodiments, the substrate 720 may be doped at a higher concentration than the semiconductor drift layer 724. In some embodiments, both the substrate 720 and the semiconductor drift layer 724 may comprise silicon carbide. Silicon carbide may be particularly beneficial in high-power and/or high-frequency devices.

The implanted wells 730 may be formed by a process of ion implantation 752 as shown in FIG. 7a. The implanted wells 730 are defined by a mask 750 blocking implantation of ions except in the implanted wells 730 and guard ring forming the peripheral of the semiconductor component 768. The implanted wells 730 form a PN junction type diode with the semiconductor drift layer 724. In an MPS diode, the implanted wells 730 may alleviate some of the stress placed on the diode under high power. The implanted wells 730 may carry some of the current through the diode when the power is high. Without the implanted wells 730, a pure Schottky diode may be overstressed and enter into thermal runaway. Thus, the implanted wells 730 enable the MPS diode to reap some of the benefits of both a Schottky diode and a PN diode.

Referring now to FIG. 7b, the mask 750 is removed from the top surface 724a of the semiconductor drift layer 724.

As depicted in FIG. 7c, the semiconductor component 768 is subjected to an annealing process to secure the implanted wells 730 in the semiconductor drift layer 724. The annealing process may include exposing the semiconductor component 768 to a high temperature and allowing the semiconductor component 768 to cool slowly. Such an annealing process may fix the implanted ions in the semiconductor drift layer 724 structure.

As depicted in FIG. 7d, an aluminum layer (e.g., first metal layer) 754 is deposited on the semiconductor component 768. The aluminum layer 754 may be deposited on the top surface 724a of the semiconductor drift layer 724 by a process such as physical vapor deposition, chemical vapor deposition, evaporation, sputtering deposition, or other similar process. As described herein, aluminum may be selected as the first metal layer because aluminum reflects laser light. Thus, there is no significant increase in temperature to the aluminum layer 754 when exposed to laser light in an annealing process. Due to the reflective nature of the aluminum, the underlying components are protected during a laser annealing process. In addition, aluminum may be caused to react with the underlying implanted wells 730 to create ohmic contacts (e.g., ohmic contacts 732 as shown in FIG. 7i).

As depicted in FIG. 7e, a titanium layer 756 is deposited on the top surface 754a of the aluminum layer 754. The titanium layer 756 may be deposited on the top surface 754a of the aluminum layer 754 by a process such as physical vapor deposition, chemical vapor deposition, evaporation, sputtering deposition, or other similar process. As described herein, titanium may be selected as the second metal layer based at least in part based on titanium's absorption of laser light. Due to the absorption by titanium of laser light when exposed to a laser light source, the titanium layer 756 will increase in temperature when exposed to a laser light source.

As depicted in FIG. 7f, a mask 758 is deposited on the top surface 756a of the titanium layer 756. The mask 758 protects the portions of the titanium layer 756 under the mask 758 from being removed during etching or another process utilized to remove the titanium layer 756. As depicted in FIG. 7f, the mask 758 is aligned with the implanted wells 730 underlying the aluminum layer 754.

As depicted in FIG. 7g, the titanium layer 756 of the semiconductor component 768 is removed from the surface of the semiconductor component 768, except where the titanium layer 756 is protected by the mask 758.

As depicted in FIG. 7h, the mask 758 is removed from the semiconductor component 768, leaving only the portions of the titanium layer 756 protected by the mask 758 on the surface of the aluminum layer 754. As depicted in FIG. 7h, the remaining portions of the titanium layer 756 are aligned with the implanted wells 730 implanted in the semiconductor drift layer 724 beneath the aluminum layer 754.

As depicted in FIG. 7i, a laser 762 directs laser light 764 across the surface of the semiconductor component 768 in a laser annealing process. A laser annealing process may be utilized to heat the portions of the semiconductor component 768 which are configured to absorb the laser light 764 (e.g., the portions of the titanium layer 756). By generating laser light 764 having a wavelength absorbed by the titanium layer 756 but reflected by the aluminum layer 754, the temperature increases at the remaining portions of the titanium layer 756 and the underlying portions of the aluminum layer 754 in contact with the titanium layer 756. However, the portions of the aluminum layer 754 not in contact with the titanium layer 756 reflect the laser light 764 and do not substantially increase in temperature.

The increase in temperature of the titanium layer 756 and underlying portions of the aluminum layer 754 enable reactions to occur between the titanium layer 756, the aluminum layer 754, and the implanted wells 730. The reactions create ohmic contacts 732 between the titanium of the titanium layer 756, the aluminum of the aluminum layer 754, and the implanted wells 730 of the semiconductor drift layer 724. Such a titanium/aluminum ohmic contact is one of the best known ohmic contacts for p-type or n-type implanted regions. Because the increase in temperature is localized based on the location of the titanium layer 756 portions, the portions of the aluminum layer 754 that do not substantially increase in temperature, do not react with the underlying semiconductor.

As depicted in FIG. 7*j*, the aluminum layer 754 is removed from the surface of the semiconductor component 768, leaving the ohmic contacts 732 formed by the titanium layer 756 and underlying aluminum layer 754 intact above the implanted wells 730.

As depicted in FIG. 7*k*, a front-side metal 726 (e.g., anode terminal 226) is deposited on the surface of the semiconductor component 768. As described in relation to FIG. 2, the front-side metal 726 may be any conductive material through which current enters the semiconductor component 568, or equivalently, electrons leave the semiconductor component 768. In some embodiments, the front-side metal 726 may comprise a metal, or combination of metals, such as molybdenum, platinum, chromium, tungsten, nickel, or other similar conductive material. As depicted in FIG. 7*k*, the front-side metal 726 is disposed on top of the ohmic contacts 732 and provides a conductive path from an external power source to the implanted wells 730 of the semiconductor component 768. The front-side metal 726 further creates a Schottky diode 770 between the front-side metal 726 and the semiconductor drift layer 724.

As depicted in FIG. 7*l*, a mask 760 is deposited on the surface of the front-side metal 726. The mask 760 defines the outer dimensions of the front-side metal in relation to the semiconductor component 768. As shown in FIG. 7*l*, the mask 760 overlaps at least a portion of the guard ring establishing the perimeter of the semiconductor component 768 under the front-side metal 726.

As depicted in FIG. 7*m*, the portions of the front-side metal 726 unprotected by the mask 760 are removed from the surface of the semiconductor component 768. As further depicted in FIG. 7*m*, the front-side metal 726 at least partially overlaps with the guard ring defining the peripheral edge of the semiconductor component 768. The front-side metal 726 provides a Schottky diode 770 contact between the front-side metal 726 and the exposed portions of the semiconductor drift layer 724. The front-side metal 726 further provides an electrical connection to the PN junction diode between the implanted wells 730 and the semiconductor drift layer 724.

As depicted in FIG. 7*n*, the mask 760 is removed from the surface of the front-side metal 726.

As depicted in FIG. 7*o*, a passivation layer 776 is deposited across the surface of the semiconductor component 768, including the front-side metal 726 and exposed portions of the semiconductor drift layer 724 as well as any other exposed surfaces. As described in relation to FIG. 4, a passivation layer 776 may comprise any material configured to coat the semiconductor component 768 so as to protect the semiconductor component 768 from corrosion, chemical reactivity, and electrical contacts. A passivation layer 776 may be formed through thermal oxidation or another similar process.

As depicted in FIG. 7*p*, a mask 778 is placed on the surface of the passivation layer 776. The mask 778 is aligned with the surface of the front-side metal 726, so as to define a path to the surface of the front-side metal 726 through the passivation layer 776.

As depicted in FIG. 7*q*, an access channel 772 is etched through the passivation layer 776, to the front-side metal 726. The access channel 772 provides an opening through the passivation layer 776 enabling access to the conductive front-side metal 726 from outside the passivation layer 776.

As depicted in FIG. 7*r*, the mask 778 is removed from the surface of the passivation layer 776. As further depicted in FIG. 7*r*, a back-side ohmic contact 774 is formed on the bottom surface of the substrate 720. In addition, a back-side metal 722 (e.g., cathode terminal 222) is disposed on the surface of the back-side ohmic contact 774.

The resulting semiconductor component 768, as shown in FIG. 7*r*, is an MPS diode without field plate edge termination.

While this detailed description has set forth some embodiments of the present invention, the appended claims cover other embodiments of the present invention which differ from the described embodiments according to various modifications and improvements. For example, one skilled in the art may recognize that such principles may be applied to any semiconductor device that benefits from a precise placement of ohmic contacts. For example, any semiconductor device utilizing a merged-PN Schottky diode or other PN diodes utilizing ohmic contacts.

Within the appended claims, unless the specific term "means for" or "step for" is used within a given claim, it is not intended that the claim be interpreted under 35 U.S.C. 112, paragraph 6.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. A method for forming an ohmic contact on a semiconductor component, the method comprising:
   depositing a first metal layer on a top surface of a semiconductor drift layer comprising an electrical contact point, wherein the first metal layer reflects a laser light;
   depositing a second metal layer on portions of the first metal layer, wherein the second metal layer is aligned with the electrical contact point, and wherein the second metal layer absorbs the laser light;
   exposing the first metal layer and the second metal layer to the laser light in a laser annealing process, wherein the second metal layer substantially increases in temperature due to the laser light, and wherein the increase in temperature causes the ohmic contact to form between the electrical contact point and the first metal layer;
   removing the second metal layer; and
   depositing a front-side metal on the ohmic contact.

2. The method of claim 1, wherein the semiconductor component is a merged-PN Schottky diode.

3. The method of claim 2, wherein the electrical contact point is an implanted well in the top surface of the semiconductor drift layer.

4. The method of claim 3, wherein the portions of the second metal layer are positioned on a top surface of the first metal layer directly opposite the implanted well.

5. The method of claim 4, wherein a first reflectivity of the first metal layer is greater than a second reflectivity of the second metal layer.

6. The method of claim 4, wherein the implanted well comprises a p-type semiconductor and the semiconductor drift layer comprises an n-type semiconductor.

7. The method of claim 4, wherein the ohmic contact forms an electrical contact with the implanted well.

8. The method of claim 1, wherein the front-side metal is an anode of the semiconductor component.

9. The method of claim 1, further comprising:
  removing the front-side metal from all areas, except a semiconductor component area on and immediately around the ohmic contact.

10. The method of claim 9, further comprising:
  depositing a passivation layer on and around the front-side metal; and
  etching an access channel to the front-side metal, through the passivation layer.

11. The method of claim 1, further comprising:
  depositing a dielectric layer on the top surface of the semiconductor drift layer and the ohmic contact;
  removing the dielectric layer directly above the top surface of the semiconductor drift layer of the semiconductor component, such that the ohmic contact is exposed; and depositing the front-side metal, on the ohmic contact and the dielectric layer.

12. The method of claim 11, further comprising:
  removing the front-side metal from all areas, except a semiconductor component area on and immediately around the ohmic contact.

13. The method of claim 12, further comprising:
  depositing a passivation layer on and immediately around the front-side metal; and
  etching an access channel to the front-side metal, through the passivation layer.

14. The method of claim 13, further comprising, creating a back-side ohmic contact on a surface opposite the passivation layer,
  wherein a back-side metal is in electrical contact with the back-side ohmic contact.

15. The method of claim 14, wherein the back-side ohmic contact is a cathode of the semiconductor component.

16. The method of claim 1, wherein the semiconductor drift layer is formed by a process of epitaxial growth on a semiconductor substrate.

17. The method of claim 16, wherein the semiconductor substrate and the semiconductor drift layer both comprise silicon carbide.

18. The method of claim 1, wherein the first metal layer comprises Aluminum.

19. The method of claim 1, wherein the second metal layer comprises Titanium.

* * * * *